(12) United States Patent
Takahashi et al.

(10) Patent No.: US 12,490,578 B2
(45) Date of Patent: Dec. 2, 2025

(54) LIGHT EMITTING DEVICE, DISPLAY DEVICE, PHOTOELECTRIC CONVERSION DEVICE, ELECTRONIC APPARATUS, ILLUMINATION DEVICE, AND MOVING BODY

(71) Applicant: CANON KABUSHIKI KAISHA, Tokyo (JP)

(72) Inventors: Tetsuo Takahashi, Kanagawa (JP); Akira Okita, Kanagawa (JP); Yojiro Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 419 days.

(21) Appl. No.: 17/986,948

(22) Filed: Nov. 15, 2022

(65) Prior Publication Data
US 2023/0189557 A1 Jun. 15, 2023

(30) Foreign Application Priority Data
Dec. 14, 2021 (JP) .................................. 2021-202775

(51) Int. Cl.
*H10K 50/813* (2023.01)
*B60Q 1/26* (2006.01)
(Continued)

(52) U.S. Cl.
CPC ......... *H10K 50/813* (2023.02); *H10K 50/822* (2023.02); *H10K 50/856* (2023.02);
(Continued)

(58) Field of Classification Search
CPC .. H10K 50/856; H10K 50/813; H10K 50/822; H10K 59/10; H10K 50/00;
(Continued)

(56) References Cited

U.S. PATENT DOCUMENTS 4,649,094 A 3/1987 Tamura
6,822,783 B2 11/2004 Matsuda
(Continued)

FOREIGN PATENT DOCUMENTS

JP 2021-072282 A 5/2021

*Primary Examiner* — Steven B Gauthier
*Assistant Examiner* — Alvin L Lee
(74) *Attorney, Agent, or Firm* — Venable LLP

(57) ABSTRACT

Alight emitting device comprising lower electrodes arranged on a substrate, an organic layer including a light emitting layer arranged to cover the lower electrodes, an upper electrode arranged to cover the organic layer, a reflective layer arranged between the substrate and the lower electrodes, and an insulating layer arranged between the reflective layer and the lower electrodes, is provided. The reflective layer is arranged to overlap the lower electrodes. The lower electrodes include a first electrode and a second electrode adjacent to each other. An upper electrode contact portion configured to electrically connect the reflective layer and the upper electrode is arranged between the first electrode and the second electrode, and the upper electrode contact portion includes a via hole in which a conductive member configured to electrically connect the reflective layer and the upper electrode is arranged.

23 Claims, 18 Drawing Sheets

(51) Int. Cl.
    *G02B 27/01* (2006.01)
    *G03G 15/00* (2006.01)
    *H10K 50/822* (2023.01)
    *H10K 50/856* (2023.01)
    *H10K 59/10* (2023.01)

(52) U.S. Cl.
    CPC .............. *B60Q 1/26* (2013.01); *G02B 27/017* (2013.01); *G03G 15/5016* (2013.01); *H10K 59/10* (2023.02)

(58) Field of Classification Search
    CPC ......... H10K 2102/3026; H10K 50/818; H10K 50/824; H10K 50/852; B60Q 1/26; G02B 27/017; G03G 15/5016
    See application file for complete search history.

(56) References Cited

U.S. PATENT DOCUMENTS

| | | | |
|---|---|---|---|
| 7,474,295 B2 | 1/2009 | Matsuda | |
| 7,492,348 B2 | 2/2009 | Matsuda | |
| 8,068,089 B2 | 11/2011 | Matsuda | |
| 8,482,515 B2 | 7/2013 | Matsuda | |
| 11,758,744 B2 * | 9/2023 | Takahashi | ............ H10K 59/124 257/40 |
| 2016/0190504 A1 * | 6/2016 | Koshihara | .............. H10K 59/35 257/72 |
| 2022/0115447 A1 | 4/2022 | Ishizuya | |
| 2022/0131112 A1 | 4/2022 | Hinata | |
| 2022/0255042 A1 | 8/2022 | Naruse et al. | |

\* cited by examiner

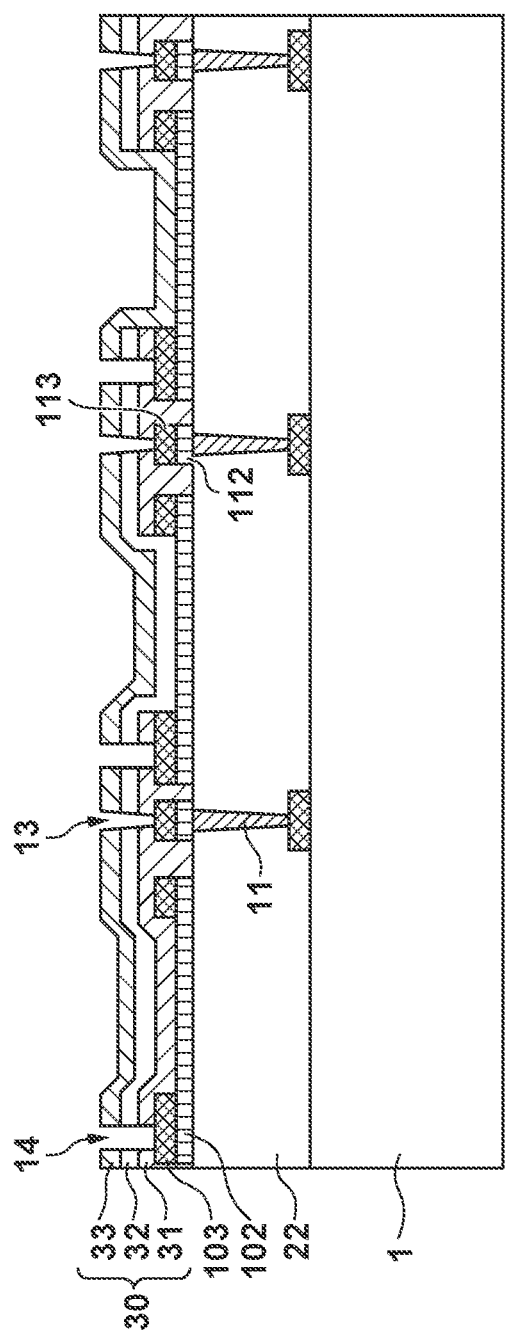
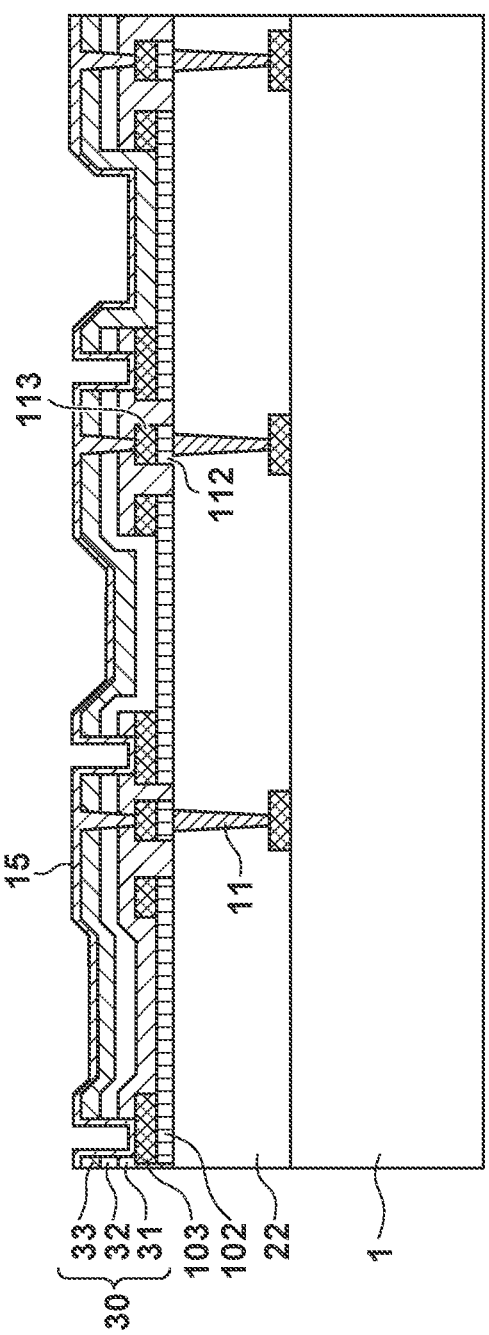
FIG. 5A
FIG. 5B

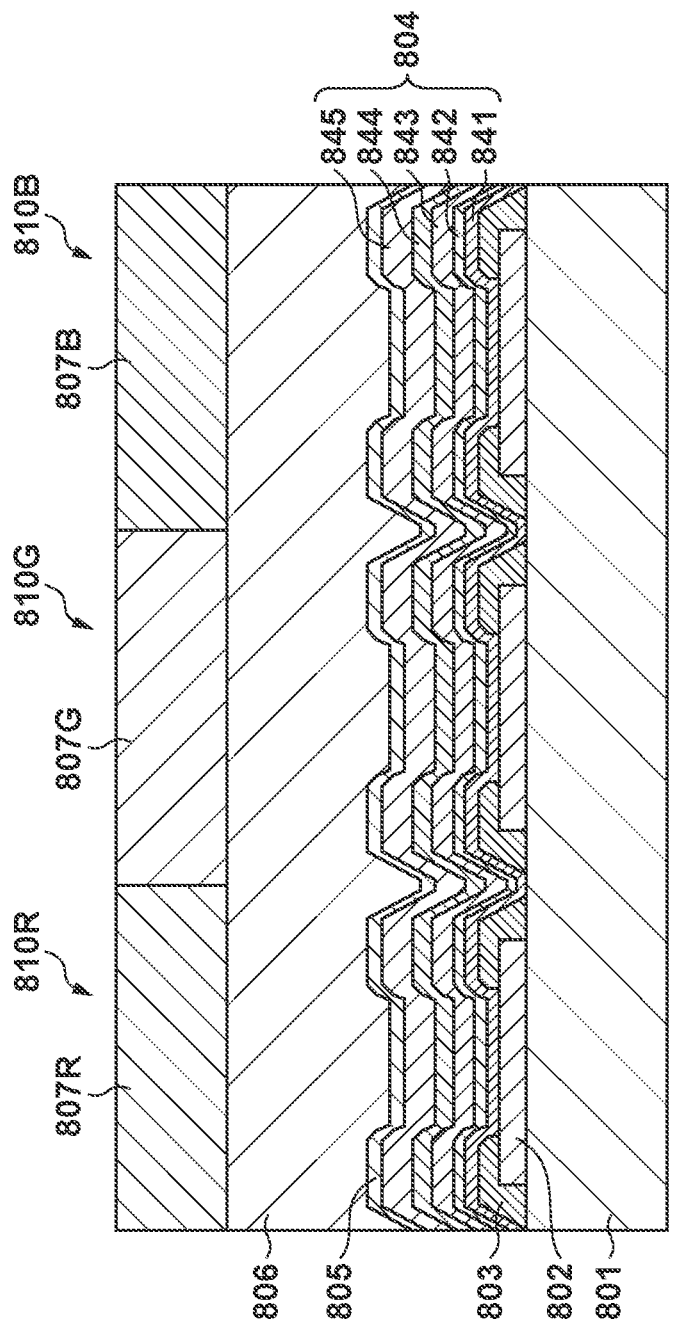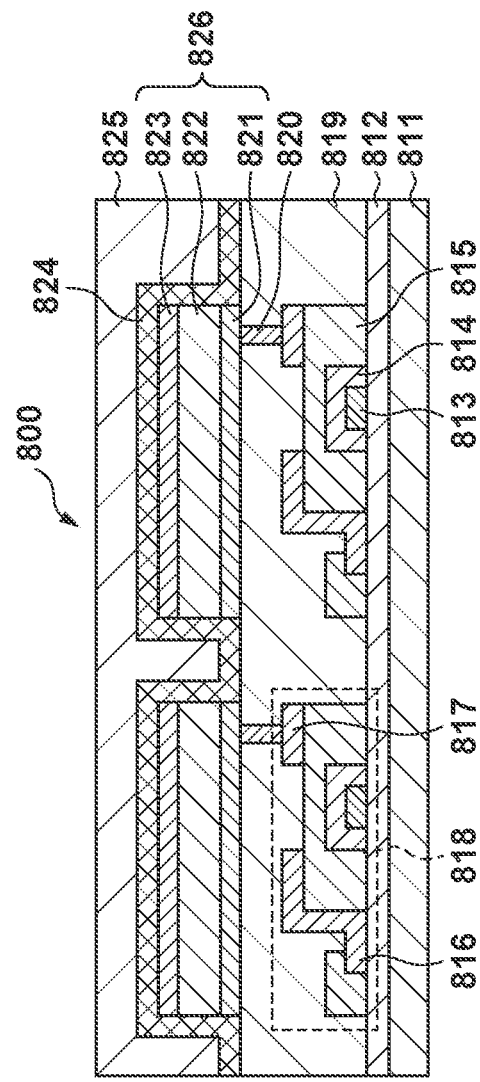
FIG. 10A
FIG. 10B

LIGHT EMITTING DEVICE, DISPLAY DEVICE, PHOTOELECTRIC CONVERSION DEVICE, ELECTRONIC APPARATUS, ILLUMINATION DEVICE, AND MOVING BODY

BACKGROUND OF THE INVENTION

Field of the Invention

The present invention relates to a light emitting device, a display device, a photoelectric conversion device, an electronic apparatus, an illumination device, and a moving body.

Description of the Related Art

Interest in a light emitting device using a self-light emitting element such as an organic electroluminescence (EL) element has increased. For color display in a light emitting device, there is known a method (white/CF method) using color filters and a light emitting element that emits white light. Japanese Patent Laid-Open No. 2021-072282 describes introduction of a resonance structure that includes a reflective portion between a substrate and a lower electrode, and changes the optical distance between the lower electrode and the reflective portion for each of pixels of different light emission colors, in addition to the white/CF method.

A voltage drop may occur due to the resistance of the upper electrode in a direction from the peripheral edge portion of an upper electrode shared by a plurality of pixels to the central portion of the upper electrode. If the voltage of the central portion of the upper electrode drops to a voltage lower than that of the peripheral edge portion, this may cause deterioration of display quality such as unevenness within a light emitting surface. As described in Japanese Patent Laid-Open No. 2021-072282, if the optical distance between the lower electrode and the reflective portion is made different for each of the pixels of different light emission colors, the height of the upper surface of an organic function film in which the upper electrode is formed is different for each light emission color. Since the upper electrode has an uneven shape corresponding to the shape of the upper surface of the organic function film, a portion with a thin film thickness is generated and thus the resistance of the upper electrode tends to be high.

Some embodiments of the present invention provide a technique advantageous in suppressing deterioration of display quality of a light emitting device.

SUMMARY OF THE INVENTION

According to some embodiments, a light emitting device comprising a display region that comprises: a plurality of lower electrodes arranged on a main surface of a substrate; an organic layer including a light emitting layer arranged to cover the plurality of lower electrodes; an upper electrode arranged to cover the organic layer; a reflective layer arranged between the main surface and the plurality of lower electrodes; and an insulating layer arranged between the reflective layer and the plurality of lower electrodes, wherein the reflective layer is arranged to overlap the plurality of lower electrodes in orthogonal projection to the main surface, the plurality of lower electrodes include a first electrode and a second electrode adjacent to each other, an upper electrode contact portion configured to electrically connect the reflective layer and the upper electrode is arranged between the first electrode and the second electrode, and the upper electrode contact portion includes a via hole in which a conductive member configured to electrically connect the reflective layer and the upper electrode is arranged, is provided.

According to some other embodiments, a light emitting device comprising: a plurality of lower electrodes arranged on a main surface of a substrate; an organic layer including a light emitting layer arranged to cover the plurality of lower electrodes; an upper electrode arranged to cover the organic layer; a reflective layer arranged between the main surface and the plurality of lower electrodes; and an insulating layer arranged between the reflective layer and the plurality of lower electrodes, wherein the reflective layer is arranged to overlap the plurality of lower electrodes in orthogonal projection to the main surface, and in a region overlapping the organic layer in the orthogonal projection to the main surface, an upper electrode contact portion configured to electrically connect the reflective layer and the upper electrode is arranged, is provided.

Further features of the present invention will become apparent from the following description of exemplary embodiments (with reference to the attached drawings).

BRIEF DESCRIPTION OF THE DRAWINGS

FIGS. 5A to 5D are sectional views showing a method of manufacturing the light emitting device shown in FIG. 1;

FIGS. 10A and 10B are sectional views for explaining an application example of the light emitting device according to the embodiment;

DESCRIPTION OF THE EMBODIMENTS

Figure 1:
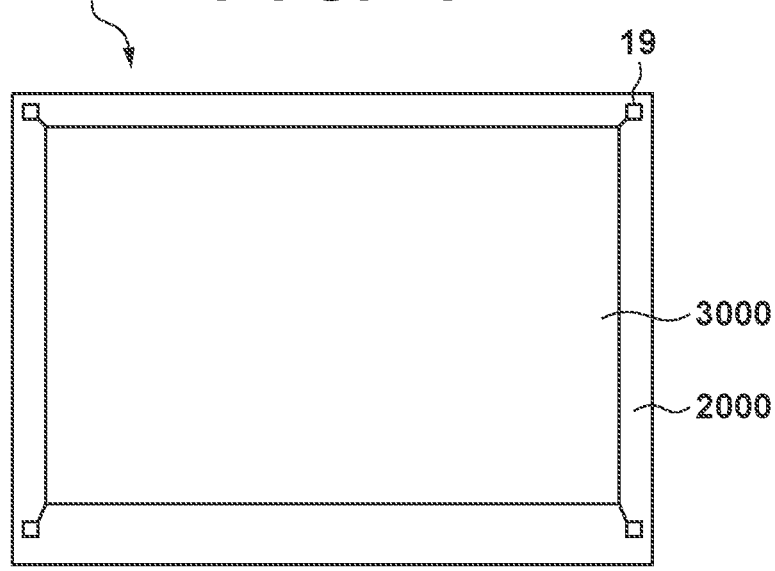
FIG. 1 is a plan view showing an example of the arrangement of a light emitting device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
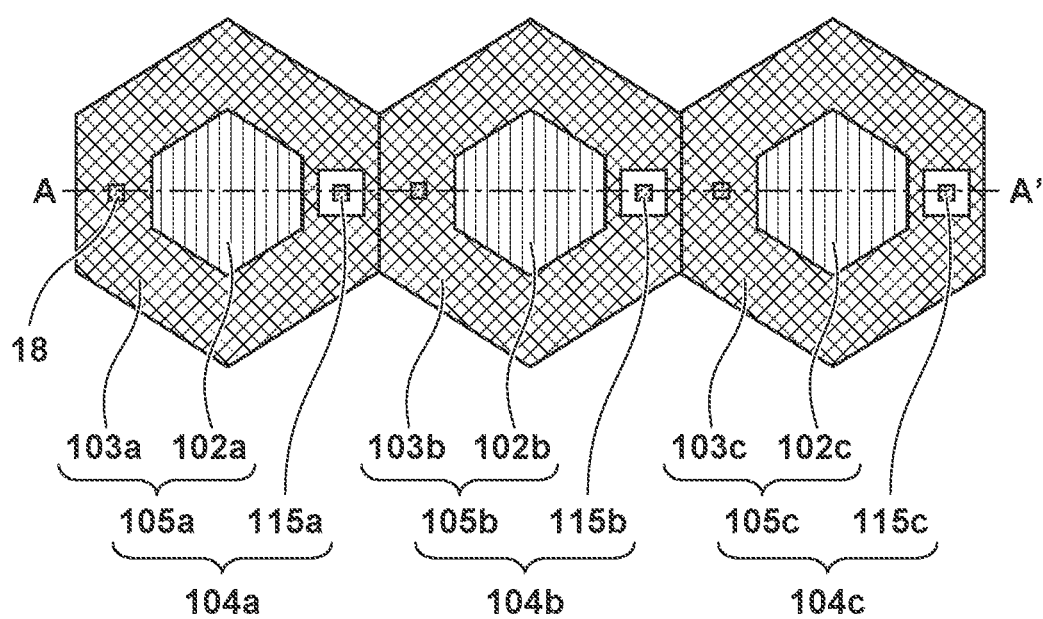
FIG. 2 is a plan view showing an example of the arrangement of the light emitting device shown in FIG. 1.
Figure 3:
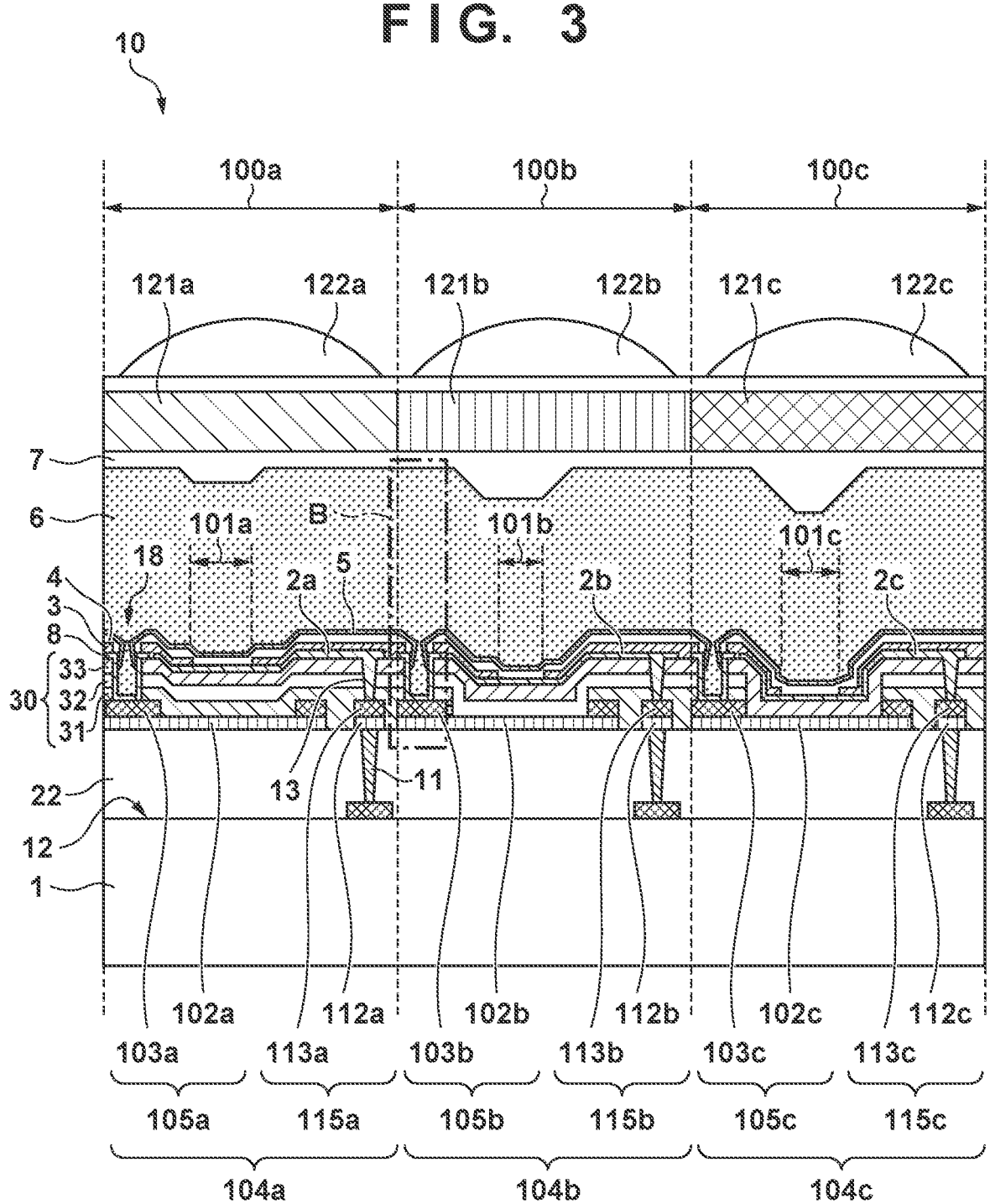
FIG. 3 is a sectional view showing an example of the arrangement of the light emitting device shown in FIG. 1.

A display device according to an embodiment of the present invention will be described with reference to FIGS. 1 to 9. FIG. 1 is a plan view showing an example of the arrangement of a light emitting device 10 according to the embodiment. FIG. 2 is an enlarged view of part of a display region 3000 of the light emitting device 10 shown in FIG. 1, and is a plan view obtained by extracting three pixels included in the display region 3000. FIG. 3 is a sectional view taken along a line A-A' in the plan view of the light emitting device 10 shown in FIG. 2.

As shown in FIG. 1, the light emitting device 10 includes the display region 3000 and a peripheral region 2000 provided on the periphery of the display region 3000. The display region 3000 is a region where organic light emitting elements 100 (to also be referred to as pixels hereinafter) each for emitting light are arrayed, and may be used to display an image, characters, and the like or may be used as a light source for perform illumination as in an application example to be described later. In the peripheral region 2000, a driving circuit for performing appropriate display in the display region 3000 and the like can be arranged. Referring to FIG. 1, the peripheral region 2000 is arranged to surround the display region 3000 but is not limited to this. For example, the peripheral region 2000 may be provided along only one side of the display region 3000 or provided along two or three sides of the display region 3000.

The light emitting device 10 will be described in more detail with reference to FIGS. 2 and 3. In the display region 3000 of the light emitting device 10, the plurality of organic light emitting elements 100 are arranged. When a specific one of the plurality of organic light emitting elements 100 is indicated, a subscript is added after a reference numeral like an organic light emitting element 100"a". When the organic light emitting elements 100 need not particularly be discriminated, they will be referred to as the "organic light emitting element 100". The same applies to other constituent elements.

The display region 3000 includes a plurality of lower electrodes 2 arranged on a main surface 12 of a substrate 1, an organic layer 4 including a light emitting layer arranged to cover the plurality of lower electrodes 2, an upper electrode 5 arranged to cover the organic layer 4, a reflective layer 102 arranged between the main surface 12 and the plurality of lower electrodes 2, and an insulating layer 30 arranged between the reflective layer 102 and the plurality of lower electrodes 2. The positions of the organic light emitting elements 100 can be decided by the lower electrodes 2 arranged electrically independent of each other. On the other hand, the organic layer 4 and the upper electrode 5 can be shared by the plurality of organic light emitting elements 100. One organic layer 4 and one upper electrode 5 may be arranged on the entire display region 3000. That is, the organic layer 4 may be formed integrally on the entire display region 3000 of the light emitting device 10 in which an image or the like is displayed. Similarly, the upper electrode 5 may be formed integrally on the entire display region 3000 of the light emitting device 10 in which an image or the like is displayed. Each organic light emitting element 100 can be a self-light emitting element such as an organic electroluminescence (EL) element.

For the substrate 1, a material that can support the respective constituent elements such as the lower electrodes 2, the organic layer 4, and the upper electrode 5 is used. As the substrate 1, for example, glass, plastic, silicon, or the like can be applied. On the substrate 1, a switching element (not shown) such as a transistor, a conductor 11, an interlayer insulating film 22, and the like can be formed.

From the viewpoint of light emission efficiency, the lower electrode 2 of the organic light emitting element 100 transmits light emitted from the light emitting layer of the organic layer 4. For the lower electrode 2, a thin film made of a transparent conductive oxide such as indium tin oxide (ITO) or zinc indium oxide (IZO), a metal such as aluminum (Al), silver (Ag), or platinum (Pt), or an alloy thereof can be used. To optimize optical interference, the film thickness of the lower electrode 2 may be different for each of the organic light emitting elements 100a, 100b, and 100c.

The organic layer 4 is arranged on the lower electrodes 2 of the organic light emitting elements 100. The organic layer 4 includes at least a light emitting layer, and may be formed from a plurality of layers. Examples of the plurality of layers are a hole injection layer, a hole transport layer, an electron blocking layer, a light emitting layer, a hole blocking layer, an electron transport layer, and an electron injection layer. In the organic layer 4, holes injected from an anode and electrons injected from a cathode recombine in the light emitting layer, and light is emitted from the light emitting layer. The light emitting layer may be formed from a single layer or a plurality of layers. The plurality of light emitting layers can contain a red light emitting material, a green light emitting material, and a blue light emitting material, respectively, and the light emission colors can be mixed to obtain white light. In addition, the light emitting layers may contain light emitting materials having a complementary color relationship, such as a blue light emitting material and a yellow light emitting material.

The organic layer 4 can be formed using a dry process such as a vacuum deposition method, an ionization deposition method, a sputtering method, or a plasma method. Instead of the dry process, a wet process that forms the organic layer 4 by dissolving a solute in an appropriate solvent and using a well-known coating method (for example, a spin coating method, a dipping method, a casting method, an LB method, an inkjet method, or the like) can be used. For example, when the organic layer 4 is formed using a vacuum deposition method, a solution coating method, or the like, crystallization of the organic layer 4 or the like hardly occurs, thereby obtaining a layer with excellent temporal stability. Furthermore, for example, when the organic layer 4 is deposited using a coating method, it is possible to form the organic layer 4 in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them. One of these binder resins may be used singly as a homopolymer or a copolymer, or two or more of them may be used in combination. Furthermore, additives such as a well-known plasticizer, antioxidant, and an ultraviolet absorber may also be used as needed.

The organic layer 4 is arranged between the lower electrodes 2 and the upper electrode 5. The organic layer 4 may be continuously formed on the upper surface of the substrate 1 and may be shared by the plurality of organic light emitting elements 100. The entire organic layer 4 or part of it may be patterned for each organic light emitting element 100. The organic layer 4 may be formed to part of the peripheral region 2000 arranged on the periphery of the display region 3000.

The upper electrode 5 transmits light emitted from the light emitting layer of the organic layer 4. The upper electrode 5 may be made of a semi-transmissive material having a characteristic of transmitting part of light that has reached the surface and reflecting the remaining part of the light (that is, a semi-transmissive and semi-reflective property). For the upper electrode 5, for example, a transparent conductive oxide such as ITO or IZO, a single metal such as Al, Ag, or gold (Au), an alkali metal such as lithium (Li) or cesium (Cs), an alkali earth metal such as magnesium (Mg), calcium (Ca), or barium (Ba), or an alloy material containing these metal materials. As the semi-transmissive material, an alloy containing Mg or Ag as a main component can be applied. The main component can be a component having the highest percent concentration of mass among materials contained in the constituent element. The upper electrode 5 may have a stacked structure in which the layers using the above-described materials are stacked as long as it has an appropriate transmittance. The upper electrode 5 may be continuously formed on the upper surface of the substrate 1 and may be shared by the plurality of organic light emitting elements 100. Similar to the organic layer 4, the upper electrode 5 may be formed to part of the peripheral region 2000 arranged on the periphery of the display region 3000. In this embodiment, the lower electrode 2 can be an anode, and the upper electrode 5 can be a cathode. Alternatively, the lower electrode 2 can be a cathode, and the upper electrode 5 can be an anode.

As shown in FIG. 3, an insulating layer 3 may be provided to cover the outer peripheral portion of the lower electrode 2. In the insulating layer 3, an opening is formed to expose part of the lower electrode 2. The insulating layer 3 is formed to make a light emitting region 101 have a desired shape correctly. If no insulating layer 3 is provided, the light emitting region 101 is defined by the shape of the lower electrode 2. The insulating layer 3 can be made of an inorganic material such as silicon nitride (SiN), silicon oxynitride (SiON), or silicon oxide (SiO). A known technique such as a sputtering method or a chemical vapor deposition method (CVD method) can be used to form the insulating layer 3. The insulating layer 3 can also be formed using an organic material such as an acrylic resin or a polyimide resin.

The display region 3000 of the light emitting device 10 can further include a protection layer 6 arranged to cover the upper electrode 5, a planarizing layer 7 arranged to cover the protection layer 6, and color filters 121 and microlenses 122 arranged on the planarizing layer 7. The protection layer 6 protects the constituent elements arranged closer to the substrate 1 than the protection layer 6 from water in the atmosphere. The protection layer 6 can be made of an inorganic material such as SiN, SiON, or SiO. The protection layer 6 may be formed using an organic material such as various kinds of resins. The protection layer 6 may have a stacked structure of these materials. The planarizing layer 7 is arranged to suppress a step generated due to a difference in thickness of the insulating layer 30 (to be described later). The planarizing layer 7 may be formed using an inorganic material, as described above, or may be formed using an organic material. Each color filter 121 transmits light of color corresponding to optical interference caused by the thickness of the insulating layer 30. For example, a color filter 121a can transmit red light, a color filter 121b can transmit green light, and a color filter 121c can transmit blue light. The microlens 122 improves the use efficiency of light emitted from the light emitting layer of the organic layer 4. The color filters 121 and the microlenses 122 can be formed using a known deposition method. A layer such as a planarizing layer may be arranged between the color filters 121 and the microlenses 122.

In this embodiment, a stacking portion 104 including the reflective layer 102 is arranged in the organic light emitting element 100. The stacking portion 104 includes a reflective region 105 in which the reflective layer 102 is arranged, and the reflective layer 102 is arranged to overlap the light emitting regions 101 of the plurality of lower electrodes 2 in orthogonal projection to the main surface 12 of the substrate 1. Furthermore, an electric corrosion suppression layer 103 is formed on the reflective layer 102. The electric corrosion suppression layer 103 of the stacking portion 104 includes an opening to expose the reflective layer 102 in at least a portion of a region overlapping the light emitting region 101 in orthogonal projection to the main surface 12 of the substrate 1. With this arrangement, light emitted from the light emitting layer of the organic layer 4 is transmitted through the lower electrode 2 and is efficiently reflected by the reflective layer 102. The size of the opening of the electric corrosion suppression layer 103 can be equal to or larger than the light emitting region 101 from the viewpoint of improvement of light emission efficiency.

Since the light reflected by the reflective layer 102 is extracted from the upper electrode 5 to the light emission side, the light emitting device 10 of this embodiment can obtain high light emission efficiency. The light emission side indicates the side of the upper electrode 5 with respect to the lower electrode 2.

For example, for the reflective layer 102, Ag or Al with a high reflectance can be used. For example, for the electric corrosion suppression layer 103, cobalt (Co), molybdenum (Mo), Pt, tantalum (Ta), titanium (Ti), titanium nitride (TiN), tungsten (W), or the like can be used. Each of the reflective layer 102 and the electric corrosion suppression layer 103 may be made of an alloy or a compound. For example, a material containing Al as a main component may be used for the reflective layer 102, and a material containing Ti or TiN as a main component may be used for the electric corrosion suppression layer 103. Furthermore, the reflective layer 102 may be made of a material containing Al as a main component and containing copper (Cu). The electric corrosion suppression layer 103 may be made of a material containing TiN as a main component. A barrier metal such as Ti or TiN may be provided on the side of the substrate 1 of the stacking portion 104.

The reflective layer 102 and the electric corrosion suppression layer 103 can be formed using a known film forming method such as a sputtering method, a CVD method, or an atomic layer deposition method (ALD method). The reflective layer 102 can be formed by depositing a material with a high reflectance on the substrate 1 and then performing patterning by a known etching process. The electric corrosion suppression layer 103 can also be formed by depositing a material on the substrate 1 and performing patterning by a known etching process. The opening of the electric corrosion suppression layer 103 provided in the stacking portion 104 can be formed by removing the electric corrosion suppression layer 103 by a known etching process.

In this embodiment, the insulating layer 30 functioning as an optical interference layer is arranged between the lower electrodes 2 and the reflective layer 102 of the stacking portion 104. By adjusting the thickness of the insulating layer 30, it is possible to optimize the optical distance between the reflective layer 102 and the light emitting layer included in the organic layer 4 of the organic light emitting element 100. This can improve the light emission efficiency of the light emitting device 10 using optical interference. The insulating layer 30 may have a single-layer structure or a stacked structure including a plurality of layers.

As shown in FIG. 3, the plurality of lower electrodes 2 include a lower electrode 2a and a lower electrode 2b adjacent to each other. Furthermore, the plurality of lower electrodes 2 include the lower electrode 2b and a lower electrode 2c adjacent to each other. At this time, with respect to the insulating layer 30, the thickness of the insulating layer 30 between the lower electrode 2a and the reflective layer 102a arranged in the organic light emitting element 100a is different from the thickness of the insulating layer 30 between the lower electrode 2b and the reflective layer 102b arranged in the organic light emitting element 100b. With respect to the insulating layer 30, the thickness of the insulating layer 30 between the lower electrode 2b and the reflective layer 102b arranged in the organic light emitting element 100b is different from the thickness of the insulating layer 30 between the lower electrode 2c and the reflective layer 102c arranged in the organic light emitting element 100c. Furthermore, as shown in FIG. 3, the thickness of the insulating layer 30 between the lower electrode 2a and the reflective layer 102a arranged in the organic light emitting element 100a is different from the thickness of the insulating layer 30 between the lower electrode 2c and the reflective layer 102c arranged in the organic light emitting element 100c.

By making the thickness of the insulating layer 30 different in each of the organic light emitting elements 100a, 100b, and 100c, it is possible to adjust the colors of light components emitted from the organic light emitting elements 100a, 100b, and 100c. The insulating layer 30 can have a stacked structure of a plurality of layers. For example, if the insulating layer 30 is made thinner in an order of the organic light emitting elements 100a, 100b, and 100c, insulating layers 31, 32, and 33 are provided as the insulating layer 30 between the lower electrode 2a and the reflective layer 102a arranged in the organic light emitting element 100a. The insulating layers 32 and 33 are provided between the lower electrode 2b and the reflective layer 102b arranged in the organic light emitting element 100b, and the insulating layer 33 is provided between the lower electrode 2c and the reflective layer 102c arranged in the organic light emitting element 100c. This can form the insulating layer 30 functioning as an optical adjustment layer.

The insulating layer 30 may be made of a material that is transparent to the light emitted from the light emitting layer of the organic layer 4. For example, SiO, SiN, SiON, or the like can be used as the insulating layer 30 (insulating layers 31 to 33). In this case, the insulating layer can be formed using a known technique such as a sputtering method, a CVD method, or an ALD method.

As shown in FIGS. 2 and 3, the stacking portion 104 may be insulated from the reflective region 105, and may include a pixel contact region 115 including a conductive pattern 112 electrically connected to the lower electrode 2. The lower electrode 2 and the pixel contact region 115 (conductive pattern 112) may electrically be connected to each other. This allows the organic light emitting element 100 to supply a potential (for example, electric power) to the lower electrode 2 via the conductive pattern 112. For example, the lower electrode 2 is supplied with a signal corresponding to the emission intensity of the organic light emitting element 100.

As the pixel contact region 115, the same layer as the reflective layer 102 and the electric corrosion suppression layer 103 of the reflective region 105 may be used. That is, the conductive pattern 112 electrically connected to each of the plurality of lower electrodes 2 may be arranged between each of the plurality of lower electrodes 2 and the main surface 12 of the substrate 1, and the distance from the main surface 12 to the reflective layer 102 may be equal to the distance from the main surface 12 to the conductive pattern 112. In this case, the pixel contact region 115 includes the conductive pattern 112 of the same layer as the reflective layer 102 and an electric corrosion suppression layer 113 of the same layer as the electric corrosion suppression layer 103. Therefore, the main component of the reflective layer 102 can be the same as that of the conductive pattern 112. Similarly, the main component of the electric corrosion suppression layer 103 can be the same that of the electric corrosion suppression layer 113.

If the insulating layer 30 is provided, the lower electrode 2 and the pixel contact region 115 can electrically be connected to each other by forming a via hole in the insulating layer 30 and forming the conductor 11 in the via hole. For the conductor 11, the same material as that of the lower electrode 2 may be used. For the conductor 11, a known conductive material such as W, Ti, or TiN can be used. The lower electrode 2 and the pixel contact region 115 may be in contact with each other via the via hole. In a portion that is in contact with the conductor 11 in the pixel contact region 115, the electric corrosion suppression layer 113 can be arranged from the viewpoint of suppression of electric corrosion.

A region where the conductor 11 is arranged can be, for example, the pixel contact region 115 where the electric corrosion suppression layer 113 of the stacking portion 104 exists, as shown in FIGS. 2 and 3. When the pixel contact region 115 and the lower electrode 2 are in direct contact with each other, if a combination of the electric corrosion suppression layer 113 and the lower electrode 2 hardly causes Galvanic corrosion, the reliability of the light emitting device 10 is improved. For example, a material containing TiN as a main component may be used for the electric corrosion suppression layer 113 and ITO or IZO may be used for the lower electrode 2 (conductor 11).

As shown in FIG. 1, the upper electrode 5 is electrically connected via a connecting portion 19 arranged in the peripheral edge portion of the upper electrode 5, and is supplied with a potential (for example, a ground potential). FIG. 1 shows a case in which a potential is supplied from each of the four corners of the upper electrode 5 but a potential may be supplied from the entire outer peripheral portion of the upper electrode 5. The peripheral edge portion of the upper electrode 5 may be a region of the upper electrode 5 not overlapping the organic layer 4 in orthogonal projection to the main surface 12 of the substrate 1. If a potential is supplied to the upper electrode 5 only from the peripheral edge portion of the upper electrode 5, a change in potential such as a voltage drop may occur due to the resistance of the upper electrode 5 in a direction from the peripheral edge portion of the upper electrode 5 to its central portion. Therefore, this may cause deterioration of display quality such as display unevenness in the display region 3000. To solve this problem, in this embodiment, as shown in FIGS. 2 and 3, the reflective layer 102 and the upper electrode 5 are electrically connected to the display region 3000, and an upper electrode contact portion 18 for supplying electric power to the upper electrode 5 is further arranged. As shown in FIG. 3, the upper electrode contact portion 18 includes a via hole in which a conductive member 8 for electrically connecting the reflective layer 102 and the upper electrode 5 is arranged. In orthogonal projection to the main surface 12 of the substrate 1, the upper electrode contact portion 18 is arranged between the lower electrodes 2*a* and 2*b*. The upper electrode contact portion 18 may be arranged between the lower electrodes 2*b* and 2*c*. The upper electrode contact portion 18 makes the potentials of the upper electrode 5 and the reflective layer 102 equal to each other. The reflective region 105 including the reflective layer 102 is electrically connected to a power supply portion (for example, a power supply or the like) arranged outside the display region 3000. The power supply portion is also connected to the above-described connecting portion 19.

With this structure, the upper electrode 5 is electrically connected to the connecting portion 19 not only in the peripheral edge portion but also in the display region 3000 via the reflective layer 102 and the upper electrode contact portion 18. Therefore, as compared with a case in which a potential is supplied only from the connecting portion 19 of the peripheral edge portion of the upper electrode 5, a change in potential such as a voltage drop is difficult to occur in the central portion of the upper electrode 5. In other words, the uniformity of the potential within the surface of the upper electrode 5 is high. The upper electrode contact portion 18 can use the reflective layer 102 as a wiring pattern to electrically connect the upper electrode 5 and the power supply portion. Therefore, it is unnecessary to form a wiring pattern for electrically connecting the upper electrode 5 in the same layer as the reflective layer 102 separately from the reflective layer 102. As a result, this is advantageous in micronizing (high-resolution) the display region 3000. As compared with a case in which a wiring pattern is additionally formed in the same layer as the reflective layer 102, the reflective layer 102 can be used as a wiring pattern, and thus a creation process can be simplified.

In orthogonal projection to the main surface 12 of the substrate 1, the upper electrode contact portion 18 can be arranged inside the region where the organic layer 4 is formed. In general, in the light emitting device 10 such as a fine organic EL device, the organic layer 4 is integrally formed on the entire display region 3000. This is because a method of separating an organic layer forming region for each organic light emitting element 100 (each pixel) requires a fine deposition process, and thus the yield may readily decrease due to the influence of a deposition positional deviation.

If the organic layer 4 is integrally formed on the entire display region 3000, when electrically connecting the upper electrode 5 and the upper electrode contact portion 18, the organic layer 4 tends to become an obstacle. On the other hand, as shown in FIG. 3, in the upper electrode contact portion 18, the conductive member 8 is arranged in a concave shape like a via hole. With the concave shape, part of an inner wall along the side wall of the via hole of the conductive member 8 is covered with the organic layer 4. In other words, in part of the inner wall of the conductive member along the side wall of the via hole, there is a portion where no organic layer 4 is formed. The upper electrode 5 is in contact with the region, that is not covered with the organic layer 4, of the inner wall of the conductive member 8 along the side wall of the via hole. This can electrically connect the upper electrode 5 and the conductive member 8.

When forming the lower electrode 2, the conductive member 8 can be formed from the same conductive film by performing patterning using an etching process. Therefore, the main component of the lower electrode 2 may be the same as that of the conductive member 8. Furthermore, similar to the above-described connection between the lower electrode 2 and the conductive pattern 112, the reflective layer 102 and the conductive member 8 may electrically be connected to each other via the electric corrosion suppression layer 103 for suppressing electric corrosion between the reflective layer 102 and the conductive member 8.

As describe above, the reflective layer 102 and the conductive pattern 112 may be conductive layers of the same layer. This can create the reflective layer 102 and the conductive pattern 112 by the same process, and can be created by a simple process. If the reflective layer 102 and the conductive pattern 112 are in the same layer, the areas of the reflective layer 102 and the conductive pattern 112 have a tradeoff relationship. Referring to FIG. 2, the area of the reflective layer 102 in the stacking portion 104 is the area of a portion represented by the area of the reflective region 105, and the area of the conductive pattern 112 is the area of a portion represented by the pixel contact region 115. As described above, in orthogonal projection to the main surface 12 of the substrate 1, the area of the reflective layer 102 may be larger than that of the conductive pattern 112. By increasing the area of the reflective layer 102 for electrical connection to the upper electrode 5, a voltage drop in the direction from the peripheral edge portion of the upper electrode 5 to its central portion can further be suppressed. Since the conductive pattern 112 has a role of connecting the lower electrode 2 and the conductor 11 in the vertical direction, the effect of suppression of a voltage drop is small even if the area of the conductive pattern 112 is increased.

In the arrangement shown in FIG. 2, the upper electrode contact portions 18 can be arranged between all the lower electrodes 2. However, the present invention is not limited to this, and one or more upper electrode contact portions 18 are arranged in the display region 3000. For example, the upper electrode contact portion 18 may be arranged for each of a predetermined number of organic light emitting elements 100. For example, the plurality of lower electrodes 2 may include not only electrodes including the upper electrode contact portion 18 therebetween, like the lower electrodes 2*a* to 2*c* shown in FIG. 3, but also two lower electrodes 2 including no upper electrode contact portion 18 therebetween and adjacent to each other. In this case as well, in the arrangement shown in FIG. 3, the distance between the centers of the lower electrodes 2*a* and 2*b* (or, for example, the lower electrodes 2*b* and 2*c*) can be equal to the distance between the centers of the two lower electrodes 2 including no upper electrode contact portion 18 therebetween and adjacent to each other. The center of the lower electrode 2 can be a geometric centroid position of the shape of the lower electrode 2 in orthogonal projection to the main surface 12 of the substrate 1.

Figure 4:
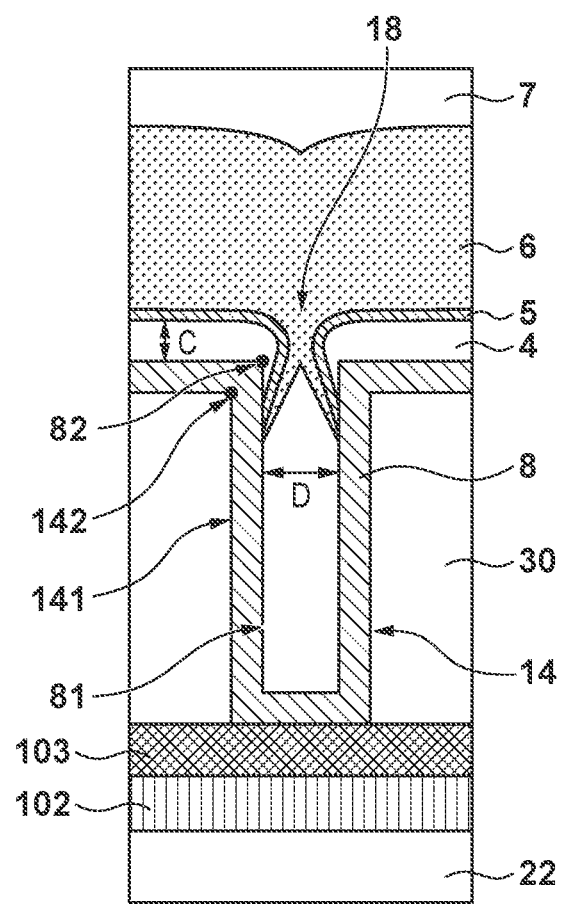
FIG. 4 is a sectional view showing an example of the arrangement of the light emitting device shown in FIG. 1.

FIG. 4 is an enlarged view of a portion B surrounded by dotted lines in FIG. 3. As shown in FIG. 4, the organic layer 4 may cover an upper end 82 of an inner wall 81, along a side wall 141 of a via hole 14, of the conductive member 8 of the upper electrode contact portion 18. When the organic layer 4 covers the upper end 82 of the inner wall 81 of the conductive member 8, the upper electrode 5 arranged on the organic layer 4 can be suppressed from being thinned and from not being formed partially in a portion bent from a direction parallel to the main surface 12 of the substrate 1 toward the inside of the via hole 14 of the upper electrode contact portion 18. As a result, it is possible to prevent the operating voltage of the light emitting device 10 from becoming high due to an increase in the resistance value of the upper electrode 5.

If a general semiconductor process is used, an upper end 142 of the side wall 141 of the via hole 14 has an angular shape. The upper end 82 of the inner wall 81 of the conductive member 8 formed to cover the via hole 14 tends to have an angular shape. If the organic layer 4 is deposited not to be formed on the inner wall 81 of the conductive member 8, the upper electrode 5 abruptly changes in shape in a portion bent toward the inner wall 81 of the conductive member 8, and is thus thinned highly probably.

On the other hand, in this embodiment, when the organic layer 4 is formed on the angular upper end 82 of the inner wall 81 of the conductive member 8, the upper surface of the organic layer 4 has a curved shape. Therefore, the change of the shape of the upper electrode 5 is gentle, and the upper electrode 5 is suppressed from being thinned and from not being formed partially.

As the effect produced when the organic layer 4 covers part of the inner wall 81 including the upper end 82 of the inner wall 81 of the conductive member 8 of the upper electrode contact portion 18, the moisture blocking performance of the protection layer 6 is improved. Consider a case in which the protection layer 6 is formed on the angular shape like the upper end 82 of the inner wall 81 of the conductive member 8. In this case, during the growth process of the protection layer 6, the density of the protection layer 6 tends to decrease in a region where a portion of the protection layer 6 which is grown on the inner wall 81 of the conductive member 8 and a portion of the protection layer 6 which is grown on the upper surface of the conductive member 8 meet. Since the region where the density of the protection layer 6 has decreased reaches the lower portion of the protection layer 6, it will allow moisture to more easily enter the organic layer 4 via this low-density region. On the other hand, according to this embodiment, when the organic layer 4 covers a portion of the inner wall 81 including the upper end 82 of the inner wall 81 of the conductive member 8, the upper surface of the organic layer 4 has a curved shape and has a structure in which its tilting angle continuously changes. Hence, the formation of a region where the grown protection layer 6 continuously meets on the different tilting angles and the density of the protective layer 6 has decreased is suppressed.

Furthermore, in an orthogonal projection to the main surface 12 of the substrate 1, a length between portions facing each other of the upper end of the inner wall 81 of the conductive member 8 along the side surface 141 of the via hole 14 may be longer than twice the thickness of the organic layer 4 (D>2C). This suppresses a state in which the organic layer 4 is embedded in the inner wall 81 of the conductive member 8, thereby making it possible to readily bring the upper electrode 5 and the conductive member 8 into contact with each other.

A method of manufacturing the light emitting device 10 will be described below with reference to FIGS. 5A to 5D. Note that the same processes as in Japanese Patent Laid-Open No. 2021-072282 can be used up to the formation of the insulating layer 30 and a description thereof will be omitted.

Figure 5C:
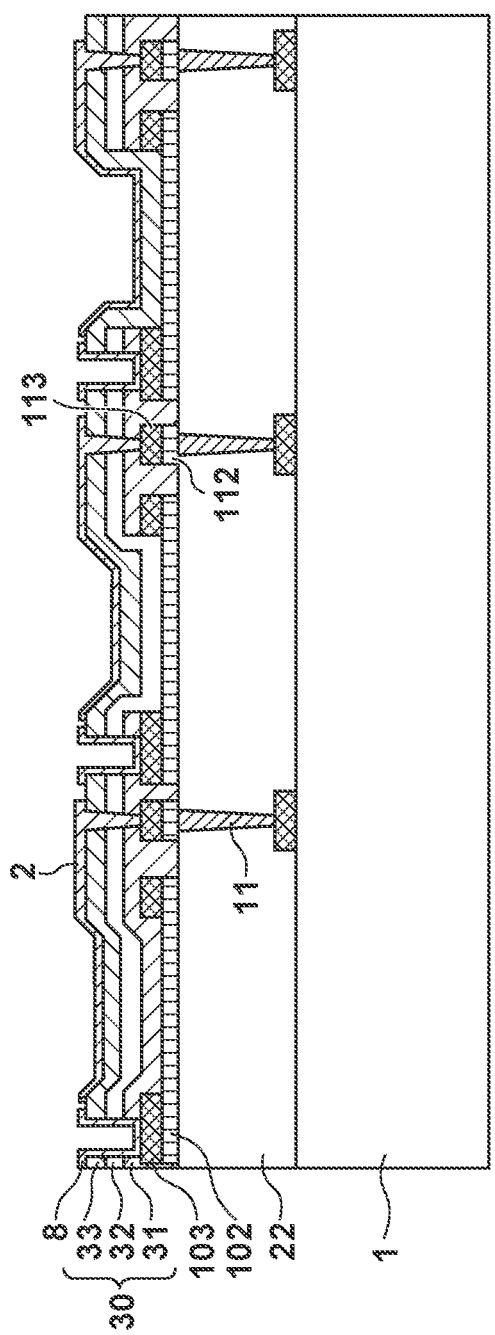

After the formation of the insulating layer 30, a via hole 13 and the via hole 14 extending through the insulating layer 30 are formed, as shown in FIG. 5A. Next, as shown in FIG. 5B, a conductive member 15 is formed using the sputtering method or the like. At this time, in the via hole 14, the conductive member 15 only covers the side wall 141 of the via hole 14, and is not embedded in the via hole 14. Next, by performing patterning using a photolithography method or the like, the lower electrode 2 and conductive member 8 are formed from the conductive member 15, as shown in FIG. 5C.

Figure 5D:
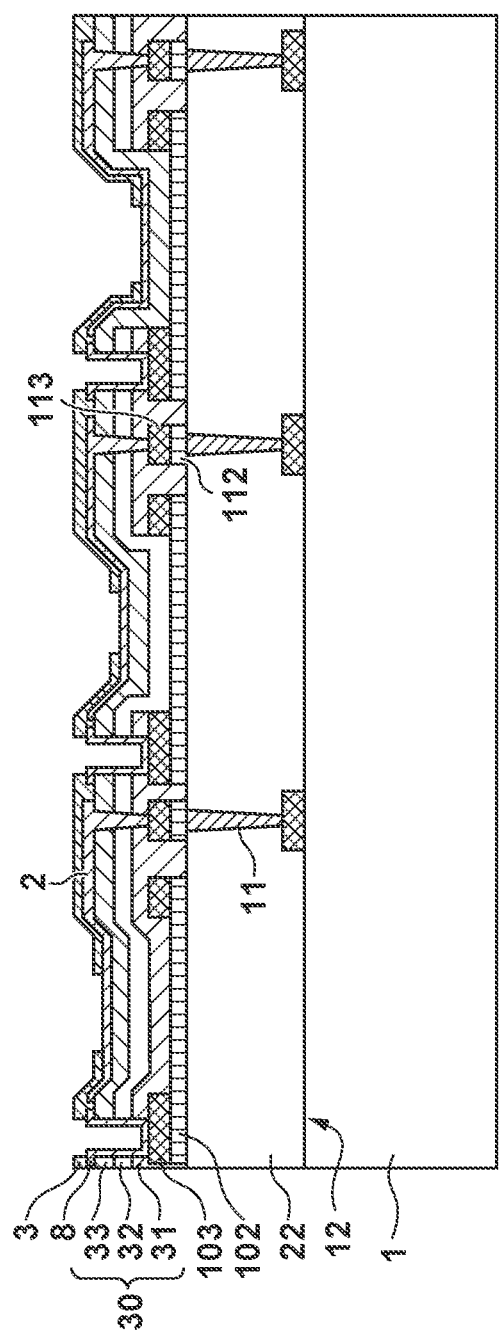

Subsequently, an insulating film is formed using the sputtering method or the like, and is patterned using the photolithography method or the like. At this time, the conductive member 8 formed in the via hole 14 needs to be exposed. That is, it is necessary to etch the insulating film formed on the inner wall 81 of the conductive member 8. Therefore, in the process of etching the insulating film, isotropic dry etching or wet etching may be used. In this process, the insulating layer 3 is formed from the insulating film, as shown in FIG. 5D.

Figure 6A:
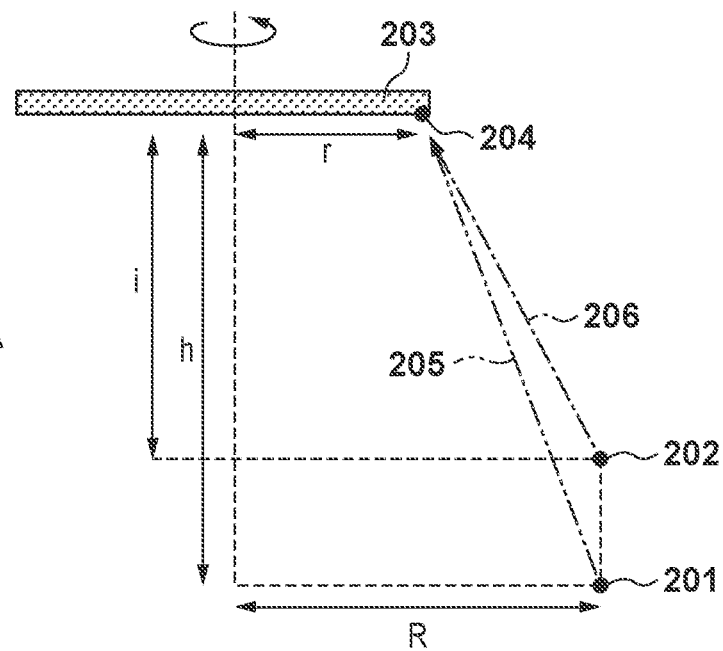
FIGS. 6A and 6B are sectional views showing the method of manufacturing the light emitting device shown in FIG. 1.

A method of forming the organic layer 4 and the upper electrode 5 will be described next with reference to FIGS. 6A and 6B. FIG. 6A is a view showing the positional relationship between the substrate 1 and deposition sources 201 and 202 at the time of forming the organic layer 4 and the upper electrode 5. The substrate 1 rotates at the time of forming the organic layer 4 and the upper electrode 5. The deposition source 202 for forming the organic layer 4 and the deposition source 201 for forming the upper electrode 5 are arranged at a position of a distance R in a direction parallel to the main surface 12 of the substrate 1 from the rotation center of the substrate 1. The deposition source 202 for forming the organic layer 4 is arranged at a position of a distance i in a direction orthogonal to the main surface 12 of the substrate 1 from the rotation center of the substrate 1. The deposition source 201 for forming the upper electrode 5 is arranged at a position of a distance h in the direction orthogonal to the main surface 12 of the substrate 1 from the rotation center of the substrate 1. At this time, the distance i is shorter than the distance h. That is, the deposition source 202 for forming the organic layer 4 is arranged at a position close to the substrate 1, as compared with the deposition source 201 for forming the upper electrode 5. Referring to FIG. 6A, the deposition sources 201 and 202 are arranged in one deposition device (chamber) for the descriptive purpose. However, FIG. 6A is a view showing the positional relationship between the substrate 1 and the deposition sources 201 and 202 at the time of forming the organic layer 4 and the upper electrode 5. Therefore, the deposition sources 201 and 202 may be arranged in different deposition devices (chambers) or in the same deposition device (chamber).

Figure 6B:
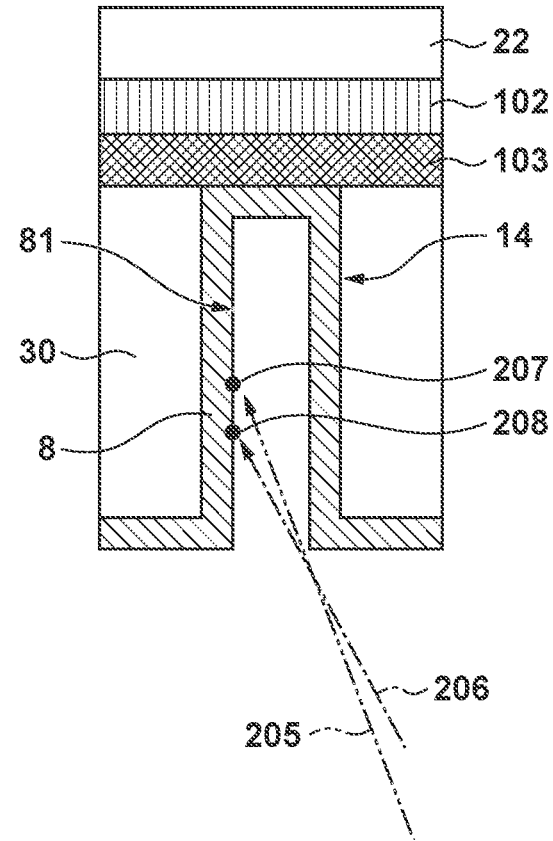

FIG. 6B is an enlarged view of the light emitting device 10, formed up to the process shown in FIG. 5A, at a position 204 (see FIG. 6A) of a distance r from the rotation center of the substrate 1. In the arrangement described with reference to FIG. 6A, an incident angle 205 at which a deposition material enters from the deposition source 201 for forming the upper electrode 5 is different from an incident angle 206 at which a deposition material enters from the deposition source 202 for forming the organic layer 4. This causes the deposition material of the upper electrode 5 to reach a position 207 deeper than a position 208 of the limit depth up to which the deposition material of the organic layer 4 enters the via hole 14. This allows the upper electrode 5 to be in contact with the inner wall 81 of the conductive member 8. A case in which a deposition method is used as the method of forming the organic layer 4 has been explained. However, for example, the organic layer 4 may be formed using a laser ablation method or the like.

Figure 7:
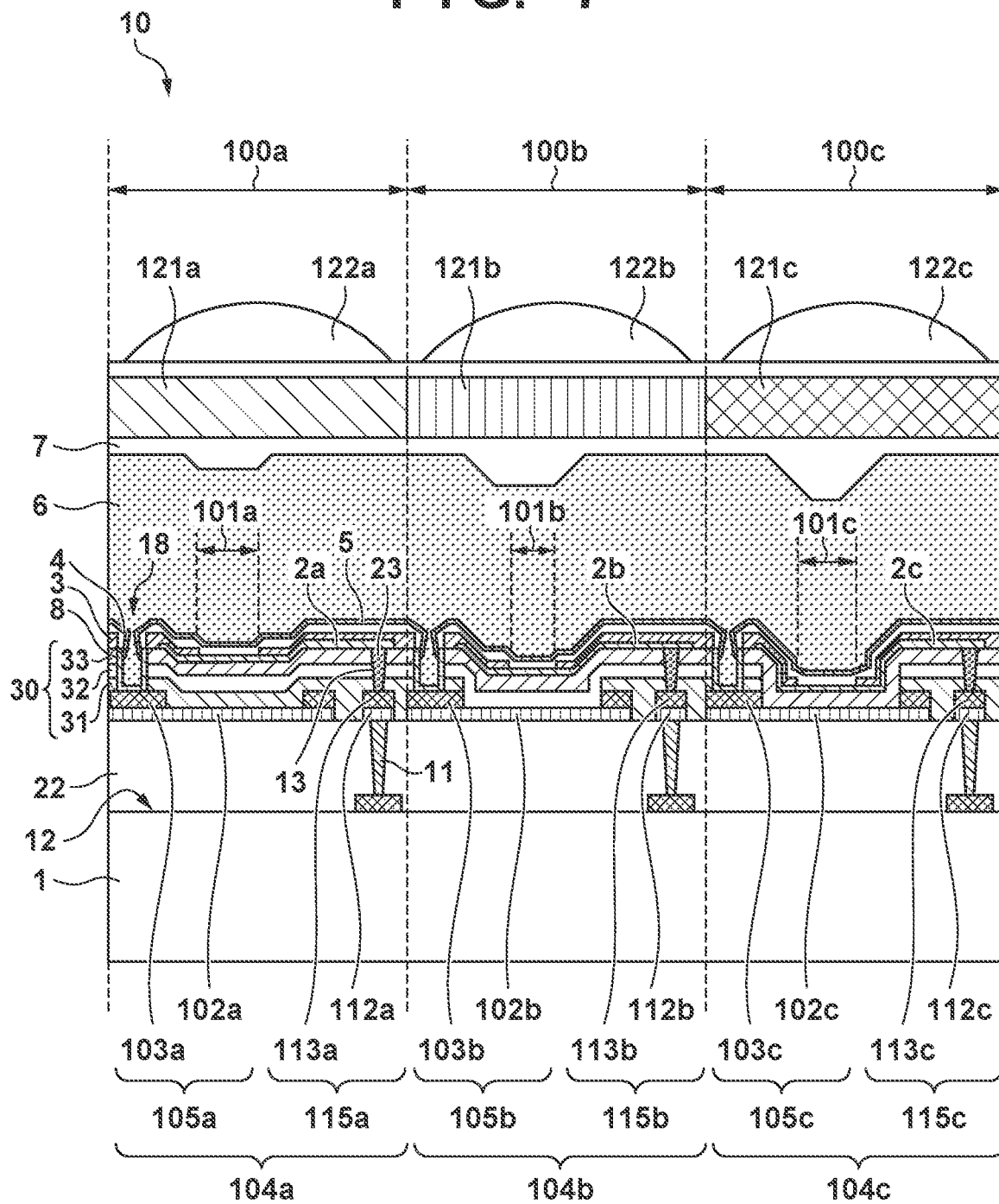
FIG. 7 is a sectional view showing a modification of the light emitting device shown in FIG. 1.

FIG. 7 is a sectional view showing a modification of the light emitting device 10 shown in FIG. 3. In the arrangement shown in FIG. 7, different materials are used for the lower electrode 2 and a conductive portion 23 between the lower electrode 2 and the pixel contact region 115. Furthermore, different materials are used for the lower electrode 2 and the conductive member 8 of the upper electrode contact portion 18. The remaining arrangement may be the same as in FIG. 3 described above. With this arrangement, choices of materials that can be used for the conductive member 8 and the conductive portion 23 increase, and the process stability can be improved more at the time of manufacturing the light emitting device 10.

In the arrangement shown in FIG. 7, the main component of the conductive member 8 may be the same as that of the conductive portion 23. This can create the conductive member 8 and the conductive portion 23 by a simple process. More specifically, a conductive material is formed in the via holes 13 and 14 shown in FIG. 5A using the CVD method or the like, and the conductive material formed on the upper surface of the insulating layer 30 is polished or etched using the CMP method or the etch back method, thereby making it possible to form the conductive member 8 and the conductive portion 23 simultaneously.

The conductive member 8 may have, for example, a stacked structure of a plurality of conductive materials. The inner wall 81 as the surface of the conductive member 8 may be made of titanium or an alloy containing titanium. Since the inner wall 81 of the conductive member 8 contains titanium, it is possible to improve the process resistance after the formation of the conductive member 8, and it is difficult to form an insulating film such as an oxide film on the inner wall 81 of the conductive member 8. Therefore, even if the process of forming the organic layer 4 and the upper electrode 5 is performed after the structure shown in FIG. 5D undergoes atmospheric exposure, an increase in the resistance value caused by the presence of an insulating film between the upper electrode 5 and the conductive member 8 is suppressed. As a result, it is possible to prevent the operating voltage of the light emitting device 10 from becoming high.

For the conductive member 8 and the conductive portion 23, a metal such as Al, Ag, Cu, or W or an alloy obtained by adding Si, nickel (Ni), or neodymium (Nd) to the metal may be used. Furthermore, the conductive member 8 and the conductive portion 23 may have stacked structure including a barrier layer. As the material of the barrier layer, a metal such as Ti, W, Mo, Au, or Ta or an alloy thereof may be used.

According to this embodiment, at least the upper portion of the via hole 13 is filled with the conductive member 15. For example, the conductive portion 23 may be embedded in the upper portion of the via hole 13 without any space. Since this suppresses unevenness of the upper surface of the lower electrode 2 formed on the conductive portion 23 to more flatten the upper surface of the lower electrode 2, the organic layer 4 arranged on the upper surface of the lower electrode 2 is difficult to be thinned, and the leakage current between the upper electrode 5 and the lower electrode 2 is suppressed.

The upper portion of the via hole 13 may be a portion above the ½ position of the via hole 13 in the vertical direction. The upper portion of the via hole 13 may be a portion above the ⅓ position of the via hole 13 in the vertical direction. The upper portion of the via hole 13 may be a portion above the ¼ or ⅕ position of the via hole 13. The upper portion of the via hole 13 may be a portion where the conductive portion 23 and the lower electrode 2 are in contact with each other.

As shown in FIG. 7, the entire via hole 13 may be filled with the conductive portion 23. At this time, a space may exist in the lower portion of the via hole 13 as a region other than the above-described upper portion. The shape of the lower portion of the conductive portion 23 in the via hole 13 need only be a shape in which the conductive portion 23 can electrically connect the pixel contact region 115 and the lower electrode 2 within a desired resistance value range.

In orthogonal projection to the main surface 12 of the substrate 1, the length between the portions facing each other of the side wall of the via hole 13 may be shorter than the length between the portions facing each other of the side wall 141 of the via hole 14. The length between the portions facing each other of the side wall of the via hole 13 or 14 corresponds to the length to a portion existing in the normal direction with respect to a portion of interest of the side wall in orthogonal projection to the main surface 12 of the substrate 1. For example, if the via hole 13 or 14 is circle, the length between the portions facing each other of the side surface of the via hole 13 or 14 corresponds to the length of the diameter of the circular via hole 13 or 14. For example, if the via hole 13 or 14 is square, the length between the portions facing each other of the side surface of the via hole 13 or 14 corresponds to the length of one side of the square via hole 13 or 14. With this arrangement, even if the conductive portion 23 and the conductive member 8 are formed simultaneously, it is possible to obtain a structure in which the via hole 13 is filled with the conductive portion 23 and the via hole 14 is not filled with the conductive member 8.

Figure 8:
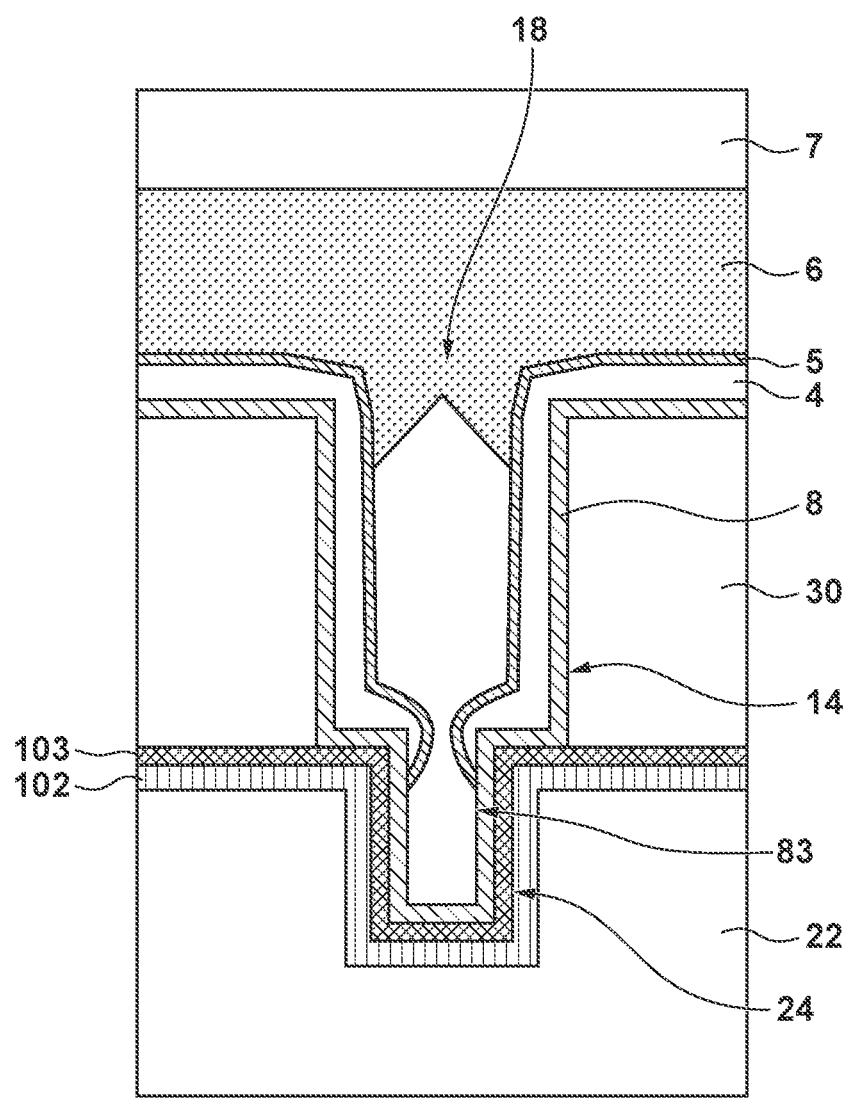
FIG. 8 is a sectional view showing an example of the arrangement of the light emitting device shown in FIG. 1.

FIG. 8 is a sectional view showing a modification of the upper electrode contact portion 18 shown in FIG. 4. In the arrangement shown in FIG. 8, a concave portion 24 is formed in the bottom portion of the via hole 14. The concave portion 24 is formed in the interlayer insulating film 22. The reflective layer 102 (and the electric corrosion suppression layer 103) is arranged along the concave portion 24. The conductive member 8 is also arranged along the concave portion 24. The upper electrode 5 is in contact with an inner wall 83 of the conductive member 8 along the concave portion 24. The remaining arrangement may be the same as that of the above-described light emitting device 10.

In the arrangement shown in FIG. 8, the reflective layer 102, the electric corrosion suppression layer 103, and the conductive member 8 are formed on the side wall of the concave portion 24, and thus the diameter of the inner wall 83 of the conductive member 8 arranged in the concave portion 24 is smaller than the diameter of the concave portion 24. Therefore, it is possible to facilitate the creation of a concave portion smaller than the processing limit of the concave portion 24, and the degree of freedom of design is enhanced.

Figure 9:
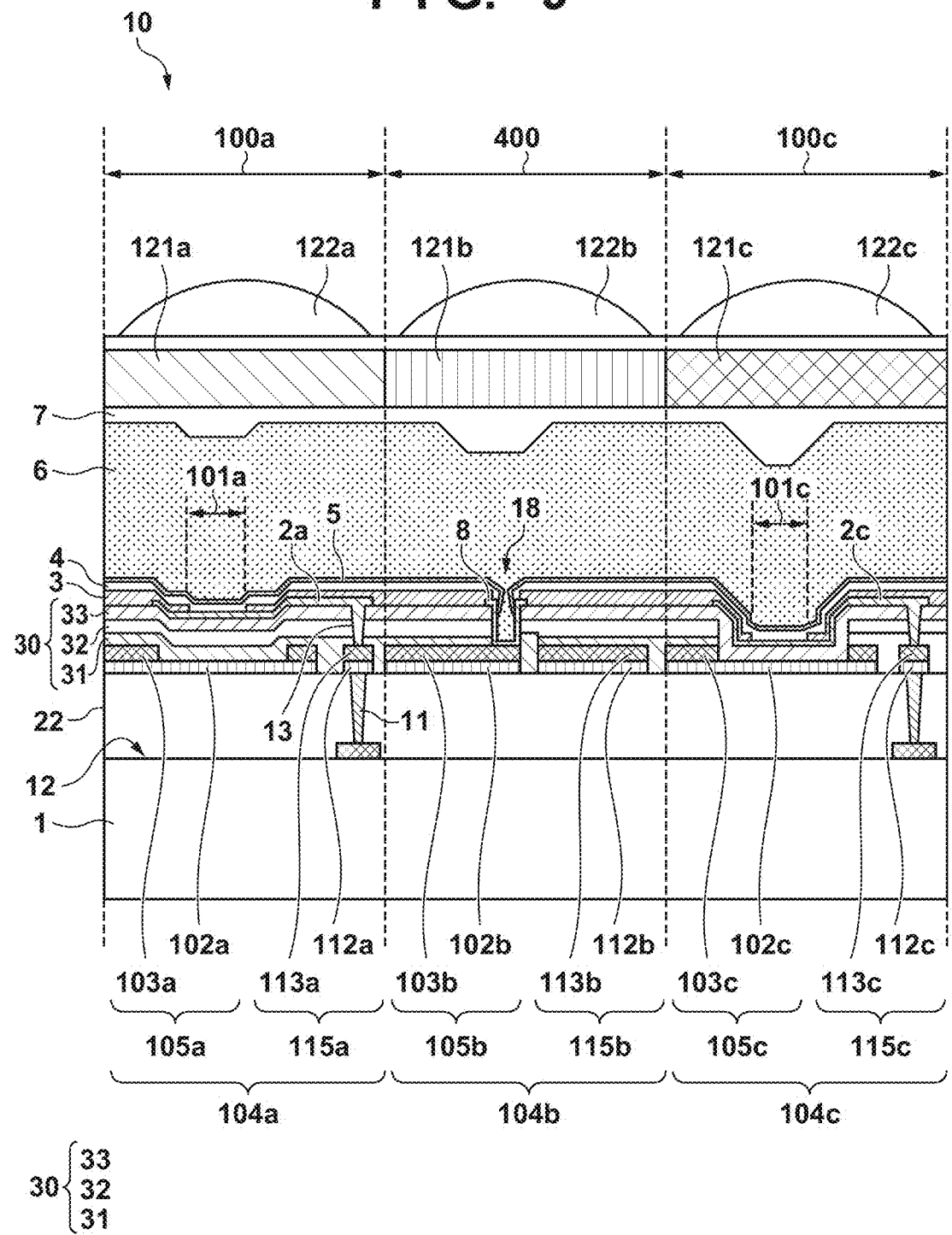
FIG. 9 is a sectional view showing a modification of the light emitting device shown in FIG. 1.

FIG. 9 is a sectional view showing a modification of the light emitting device 10 shown in FIGS. 1 and 7. The light emitting device 10 shown in FIG. 9 replaces, by non-light emitting elements 400, some of the plurality of organic light emitting elements 100 arranged in an array in the display region 3000. In the arrangement shown in FIG. 9, the organic light emitting element 100b shown in FIG. 1 is replaced by the non-light emitting element 400. Therefore, the lower electrodes 2a and 2c of the plurality of lower electrodes 2 are adjacent to each other. The remaining arrangement may be the same as that of the light emitting device 10 described with reference to FIGS. 1 and 7 and the different points will mainly be described.

The upper electrode contact portion 18 can be arranged in the non-light emitting element 400. The lower electrode 2 need not be formed in the non-light emitting element 400, and a conductive member that electrically connects the lower electrode 2 and the driving circuit and the like arranged in the peripheral region 2000 need not be formed. Therefore, since a member necessary to cause the light emitting layer of the organic layer 4 to emit light need not be arranged in the non-light emitting element 400, a space where the upper electrode contact portion 18 is arranged is readily made. The light emitting device 10 shown in FIG. 9 is thus suitable for micronizing the display region 3000.

For example, if the light emission colors of the organic light emitting elements 100 (sub-pixels) are four kinds of colors of red, green, blue, and white, the organic light emitting element 100 for emitting white light may be replaced by the non-light emitting element 400. This is because white can be output using the organic light emitting elements 100 (sub-pixels) for emitting light components of red, green, and blue. In this case, one or more upper electrode contact portions 18 are arranged in the display region 3000. For example, the upper electrode contact portion 18 may be arranged for each of a predetermined number of organic light emitting elements 100.

The plurality of lower electrodes 2 may include not only the electrodes including the upper electrode contact portion 18 therebetween like the lower electrodes 2a and 2c shown in FIG. 9 but also the two lower electrodes 2 including no upper electrode contact portion 18 (non-light emitting element 400) therebetween and adjacent to each other. In this case, the distance between the centers of the lower electrodes 2a and 2c can be longer than the distance between the centers of the two lower electrodes 2 including no upper electrode contact portion 18 (non-light emitting element 400) therebetween and adjacent to each other. If the organic light emitting elements 100 (and the non-light emitting elements 400) are arranged in an array at a predetermined period, the distance between the centers of the lower electrodes 2a and 2c can be twice the distance between the centers of the two lower electrodes 2 including no upper electrode contact portion 18 (non-light emitting element 400) therebetween and adjacent to each other.

As described above, in the light emitting device 10, even if the insulating layer 30 is arranged between the lower electrode 2 and the reflective layer 102 and the optical distance is made different for each of pixels of different light emission colors, a potential can be supplied to the upper electrode 5 in the display region 3000 where the organic layer 4 including the light emitting layer is arranged. This can implement the light emitting device 10 in which deterioration of display quality such as unevenness within a light emitting surface caused by the resistance of the upper electrode 5 is suppressed.

Application examples in which the light emitting device 10 according to this embodiment is applied to an image forming device, a display device, a photoelectric conversion device, an electronic apparatus, an illumination device, a moving body, and a wearable device will be described here with reference to FIGS. 10A and 10B to 18A and 18B. Details of the components of the above-described light emitting device 10 and modifications will be described first, and the application examples will be described after that. In the following explanation, the organic layer 4 will sometimes be expressed as an organic compound layer.

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

The organic light emitting device includes a plurality of pixels. Each pixel includes sub-pixels (corresponding to the above-described organic light emitting elements 100) that emit light components of different colors. The sub-pixels include, for example, R, G, and B emission colors, respectively.

In each pixel, a region also called a pixel opening emits light. This region is the same as the first region.

The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle. The shape of the sub-pixel and the pixel arrangement can be used in combination.

The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

The light emitting device according to the embodiment will be described next with reference to the accompanying drawings.

FIGS. 10A and 10B are schematic sectional views showing an example of the light emitting device including an organic light emitting element and a transistor connected to the organic light emitting element. The transistor is an example of an active element. The transistor may be a thin-film transistor (TFT).

FIG. 10A shows an example of a pixel as a constituent element of the light emitting device according to this embodiment. The pixel includes sub-pixels 810 (corresponding to the above-described organic light emitting elements 100). The sub-pixels are divided into sub-pixels 810R, 810G, and 810B by emitted light components. The light emission colors may be discriminated by the wavelengths of light components emitted from the light emitting layers, or light emitted from each sub-pixel may be selectively transmitted or undergo color conversion by a color filter or the like. Each sub-pixel includes a reflective electrode 802 as the first electrode on an interlayer insulating layer 801, an insulating layer 803 covering the end of the reflective electrode 802, an organic compound layer 804 covering the first electrode and the insulating layer, a transparent electrode 805 as the second electrode, a protection layer 806, and a color filter 807.

The interlayer insulating layer 801 can include a transistor and a capacitive element arranged in the interlayer insulating layer 801 or a layer below it. The transistor and the first electrode can electrically be connected via a contact hole (not shown) or the like.

The insulating layer 803 is also called a bank or a pixel separation film. The insulating layer 803 covers the end of the first electrode, and is arranged to surround the first electrode. A portion where no insulating layer is arranged is in contact with the organic compound layer 804 to form a light emitting region.

The organic compound layer 804 includes a hole injection layer 841, a hole transport layer 842, a first light emitting layer 843, a second light emitting layer 844, and an electron transport layer 845.

The second electrode may be a transparent electrode, a reflective electrode, or a semi-transmissive electrode.

The protection layer 806 suppresses permeation of water into the organic compound layer. The protection layer is shown as a single layer but may include a plurality of layers. Each layer can be an inorganic compound layer or an organic compound layer.

The color filter 807 is divided into color filters 807R, 807G, and 807B by colors. The color filters can be formed on a planarizing film (not shown). A resin protection layer (not shown) can be provided on the color filters. The color filters can be formed on the protection layer 806. Also, the color filters can be provided on the counter substrate such as a glass substrate, and then the substrate may be bonded.

A light emitting device 800 shown in FIG. 10B is provided with an organic light emitting element 826 and a TFT 818 as an example of a transistor. A substrate 811 of glass, silicon, or the like is provided and an insulating layer 812 is provided on the substrate 811. The active element such as the TFT 818 is arranged on the insulating layer, and a gate electrode 813, a gate insulating film 814, and a semiconductor layer 815 of the active element are arranged. The TFT 818 further includes the semiconductor layer 815, a drain electrode 816, and a source electrode 817. An insulating film 819 is provided on the TFT 818. The source electrode 817 and an anode 821 forming the organic light emitting element 826 are connected via a contact hole 820 formed in the insulating film.

Note that a method of electrically connecting the electrodes (anode and cathode) included in the organic light emitting element 826 and the electrodes (source electrode and drain electrode) included in the TFT is not limited to that shown in FIG. 10B. That is, one of the anode and cathode and one of the source electrode and drain electrode of the TFT are electrically connected. The TFT indicates a thin-film transistor.

In the light emitting device 800 shown in FIG. 10B, an organic compound layer is illustrated as one layer. However, an organic compound layer 822 may include a plurality of layers. A first protection layer 824 and a second protection layer 825 are provided on a cathode 823 to suppress deterioration of the organic light emitting element.

A transistor is used as a switching element in the light emitting device 800 shown in FIG. 10B but may be used as another switching element.

The transistor used in the light emitting device 800 shown in FIG. 10B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that a thin-film transistor is also called a TFT element.

The transistor included in the light emitting device 800 shown in FIG. 10B may be formed in the substrate such as an Si substrate. Forming the transistor in the substrate means forming the transistor by processing the substrate such as an Si substrate. That is, when the transistor is included in the substrate, it can be considered that the substrate and the transistor are formed integrally.

The light emission luminance of the organic light emitting element according to this embodiment can be controlled by the TFT which is an example of a switching element, and the plurality of organic light emitting elements can be provided in a plane to display an image with the light emission luminances of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light emitting element is preferably provided on the Si substrate.

Figure 11A:
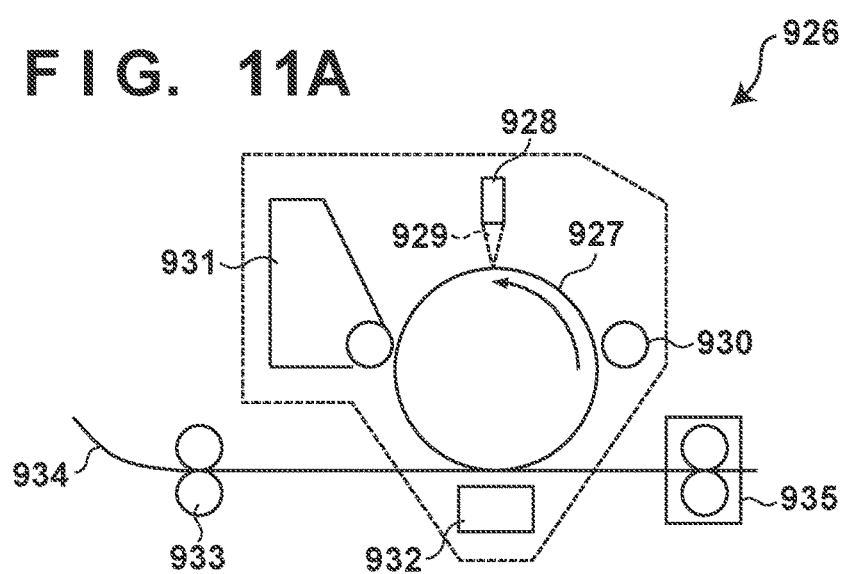
FIGS. 11A to 11C are views showing an example of an image forming device using the light emitting device according to the embodiment.
Figure 11B:
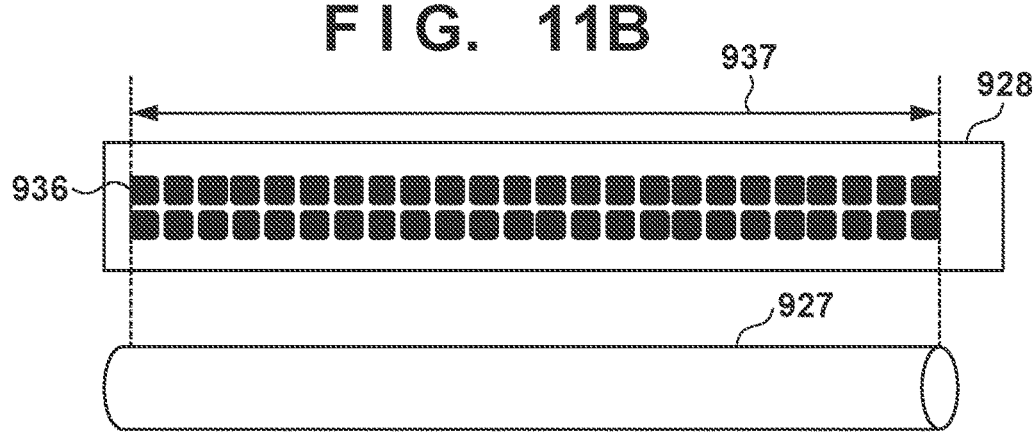
Figure 11C:
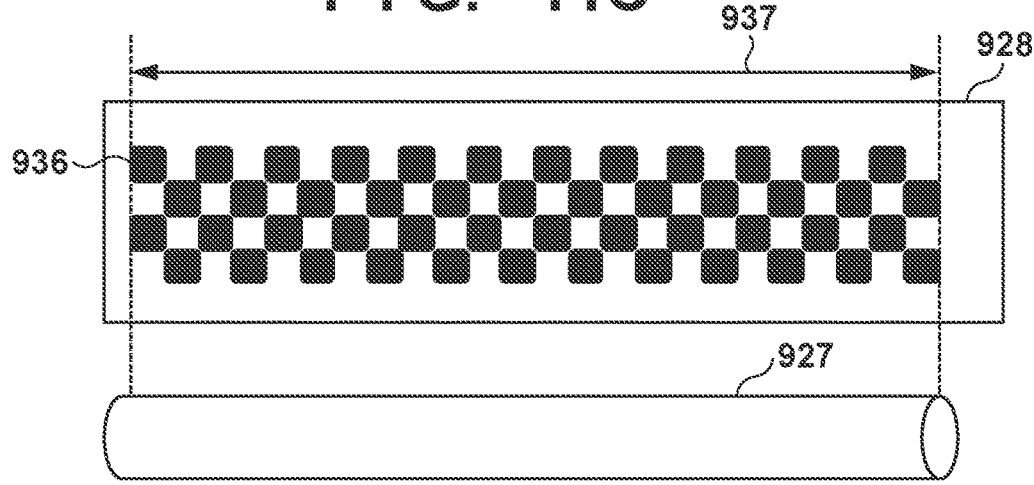

FIGS. 11A to 11C are schematic views showing an example of an image forming device using the light emitting device 10 of this embodiment. An image forming device 926 shown in FIG. 11A includes a photosensitive member 927, an exposure light source 928, a developing unit 931, a charging unit 930, a transfer device 932, a conveyance unit 933 (a conveyance roller in the arrangement shown in FIG. 11A), and a fixing device 935.

Light 929 is emitted from the exposure light source 928, and an electrostatic latent image is formed on the surface of the photosensitive member 927. The light emitting device 10 according to this embodiment can be applied to the exposure light source 928. The developing unit 931 can function as a developing device that includes a toner or the like as a developing agent and applies the developing agent to the exposed photosensitive member 927. The charging unit 930 charges the photosensitive member 927. The transfer device 932 transfers the developed image to a print medium 934. The conveyance unit 933 conveys the print medium 934. The print medium 934 can be, for example, paper or a film. The fixing device 935 fixes the image formed on the print medium.

Each of FIGS. 11B and 11C is a schematic view showing a plurality of light emitting units 936 arranged in the exposure light source 928 along the longitudinal direction of a long substrate. The light emitting device 10 according to this embodiment can be applied to each of the light emitting units 936. That is, the plurality of organic light emitting elements 100 arranged in the display region are arranged along the longitudinal direction of the substrate. A direction 937 is a direction parallel to the axis of the photosensitive member 927. This column direction matches the direction of the axis upon rotating the photosensitive member 927. This direction 937 can also be referred to as the long-axis direction of the photosensitive member 927.

FIG. 11B shows a form in which the light emitting units 936 are arranged along the long-axis direction of the photosensitive member 927. FIG. 11C shows a form, which is a modification of the arrangement of the light emitting units 936 shown in FIG. 11B, in which the light emitting units 936 are arranged in the column direction alternately between the first column and the second column. The light emitting units 936 are arranged at different positions in the row direction between the first column and the second column. In the first column, the plurality of light emitting units 936 are arranged spaced apart from each other. In the second column, the light emitting unit 936 is arranged at the position corresponding to the space between the light emitting units 936 in the first column. Furthermore, in the row direction, the plurality of light emitting units 936 are arranged spaced apart from each other. The arrangement of the light emitting units 936 shown in FIG. 11C can be referred to as, for example, an arrangement in a grid pattern, an arrangement in a staggered pattern, or an arrangement in a checkered pattern.

Figure 12:
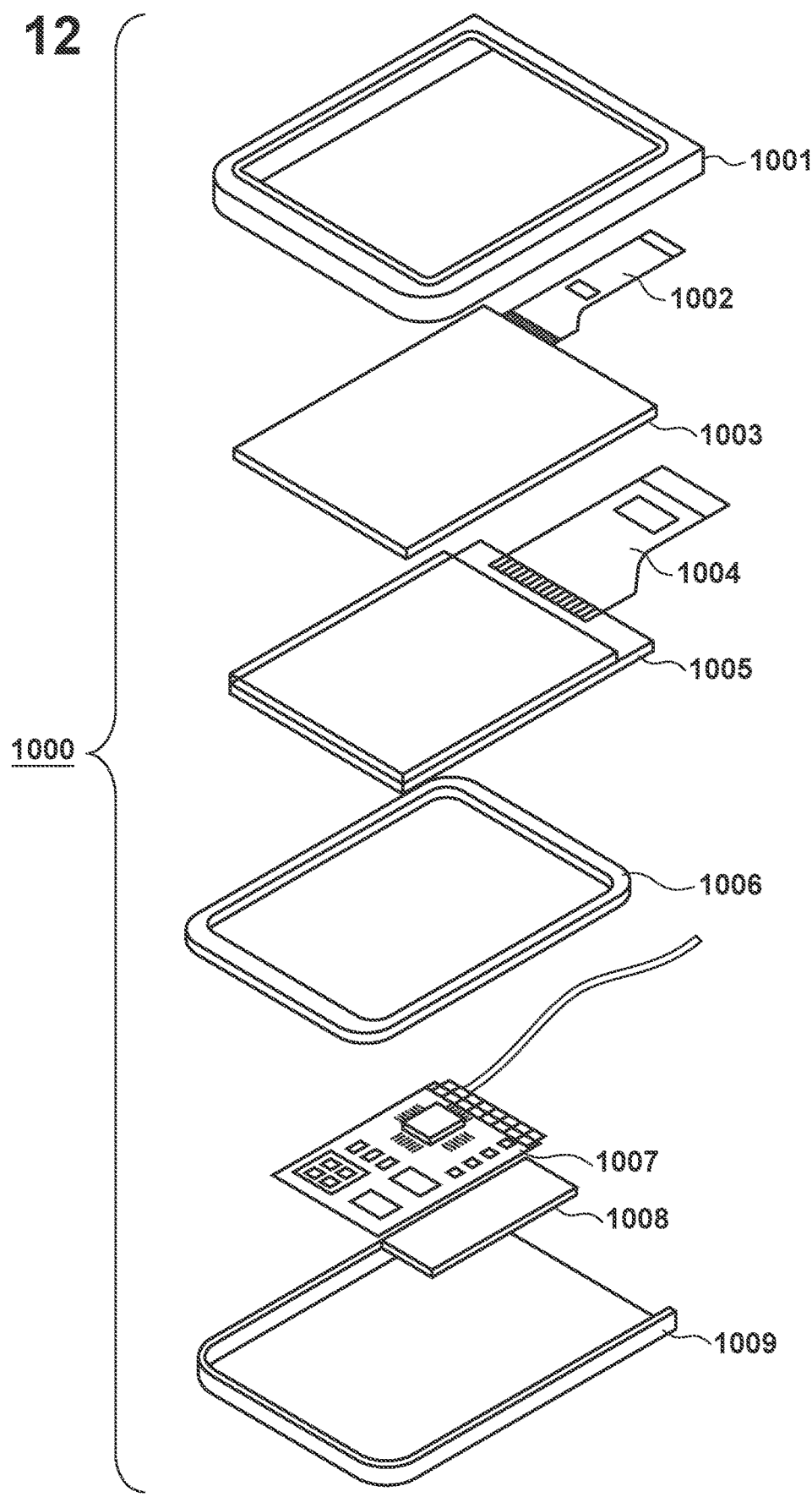
FIG. 12 is a view showing an example of a display device using the light emitting device according to the embodiment.

FIG. 12 is a schematic view showing an example of the display device using the light emitting device 10 of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The light emitting device 10 according to this embodiment can be applied to the display panel 1005. The display region of the light emitting device 10 functioning as the display panel 1005 is connected to the active elements such as transistors arranged on the circuit board 1007 and operates.

The display device 1000 shown in FIG. 12 can be used for a display unit of a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 13:
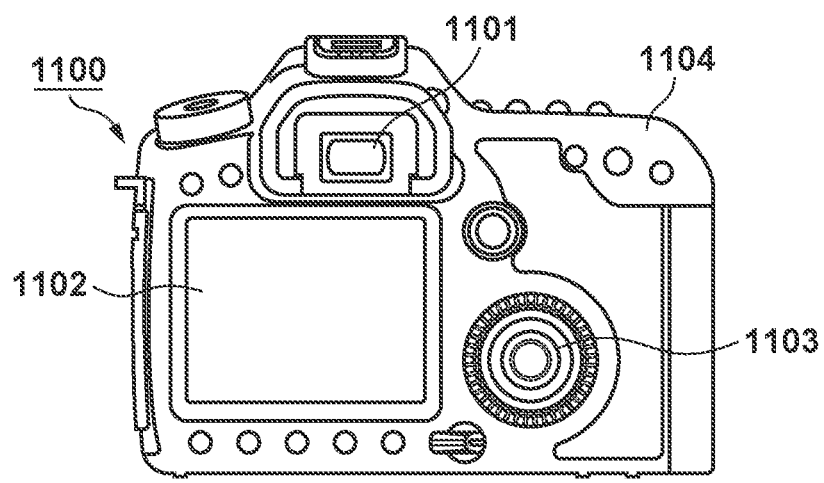
FIG. 13 is a view showing an example of a photoelectric conversion device using the light emitting device according to the embodiment.

FIG. 13 is a schematic view showing an example of the photoelectric conversion device using the light emitting device 10 of this embodiment. A photoelectric conversion device 1100 can include a viewfinder 1101, a rear display 1102, an operation unit 1103, and a housing 1104. The photoelectric conversion device 1100 can also be called an image capturing device. The light emitting device 10 according to this embodiment can be applied to the viewfinder 1101 as a display unit. In this case, the light emitting device 10 can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information is preferably displayed as soon as possible. Therefore, the light emitting device 10 containing the organic light emitting material such as an organic EL element in the light emitting layer can be used for the viewfinder 1101. This is so because the organic light emitting material has a high response speed. The light emitting device 10 using the organic light emitting material can be used for the apparatuses that require a high display speed more preferably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The light emitting device 10 may be applied to a display unit of an electronic apparatus. At this time, the display unit can have both a display function and an operation function. Examples of the portable terminal are a portable phone such as a smartphone, a tablet, and a head mounted display.

Figure 14:
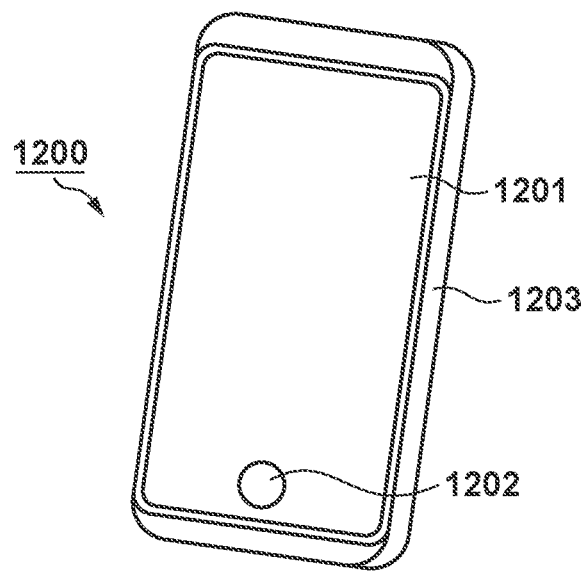
FIG. 14 is a view showing an example of an electronic apparatus using the light emitting device according to the embodiment.

FIG. 14 is a schematic view showing an example of an electronic apparatus using the light emitting device 10 of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The light emitting device 10 according to this embodiment can be applied to the display unit 1201.

Figure 15A:
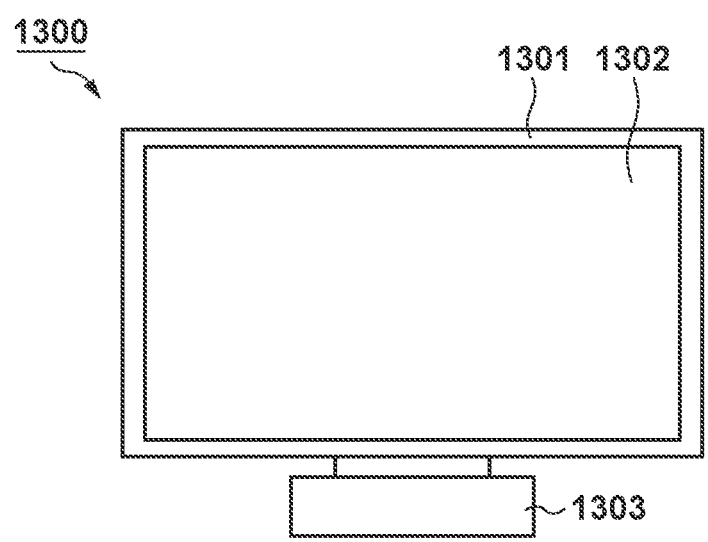
FIGS. 15A and 15B are views each showing an example of a display device using the light emitting device according to the embodiment.
Figure 15B:
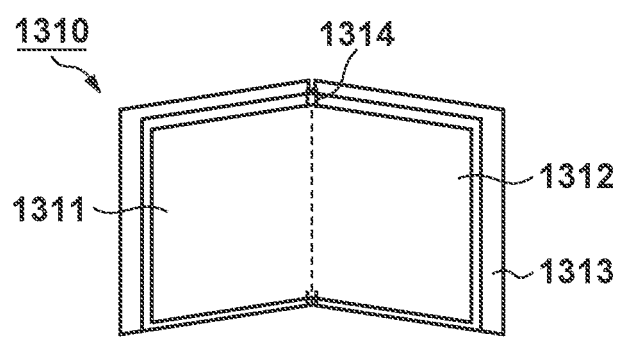

FIGS. 15A and 15B are schematic views showing examples of the display device using the light emitting device 10 of this embodiment. FIG. 15A shows a display device such as a television monitor or a PC monitor. A display device 1300 includes a frame 1301 and a display unit 1302. The light emitting device 10 according to this embodiment can be applied to the display unit 1302. The display device 1300 can include a base 1303 that supports the frame 1301 and the display unit 1302. The base 1303 is not limited to the form shown in FIG. 15A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 15B is a schematic view showing another example of the display device using the light emitting device 10 of this embodiment. A display device 1310 shown in FIG. 15B can be folded, and is a so-called foldable display device. The display device 1310 includes a first display unit 1311, a second display unit 1312, a housing 1313, and a bending point 1314. The light emitting device 10 according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 16:
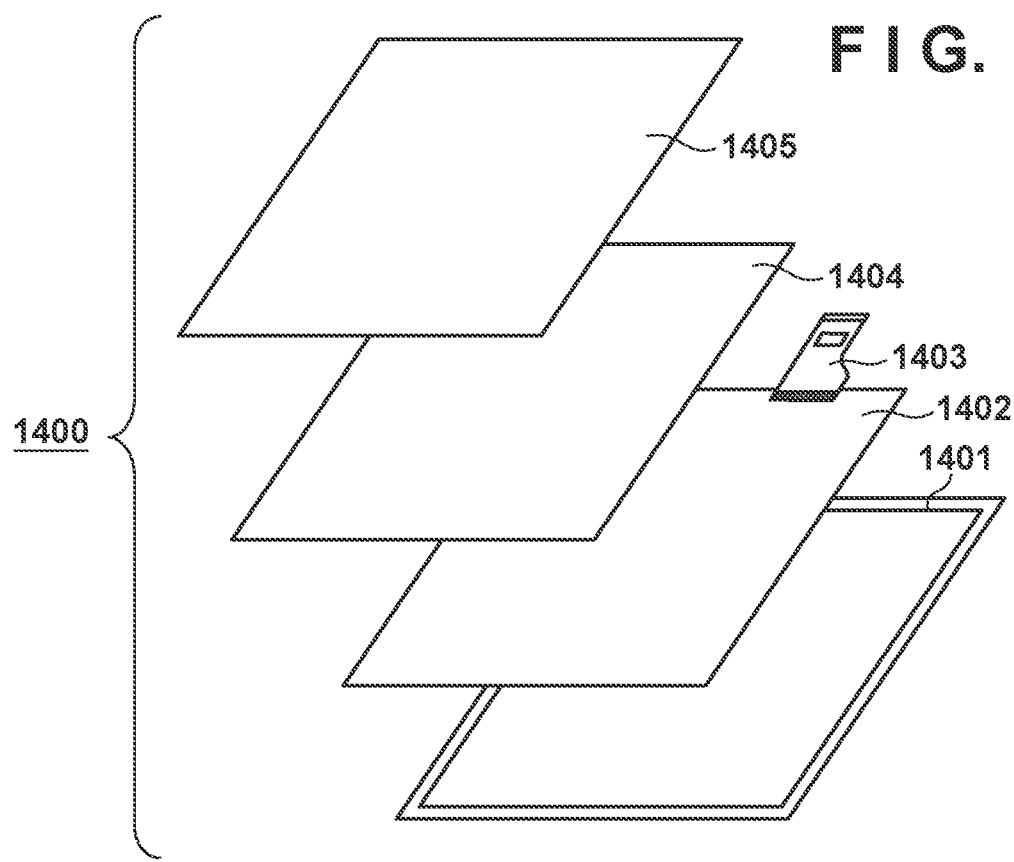
FIG. 16 is a view showing an example of an illumination device using the light emitting device according to the embodiment.

FIG. 16 is a schematic view showing an example of the illumination device using the light emitting device 10 of this embodiment. An illumination device 1400 can include a housing 1401, a light source 1402, a circuit board 1403, an optical film 1404, and a light diffusing unit 1405. The light emitting device 10 according to this embodiment can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the light emitting device 10 functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 17:
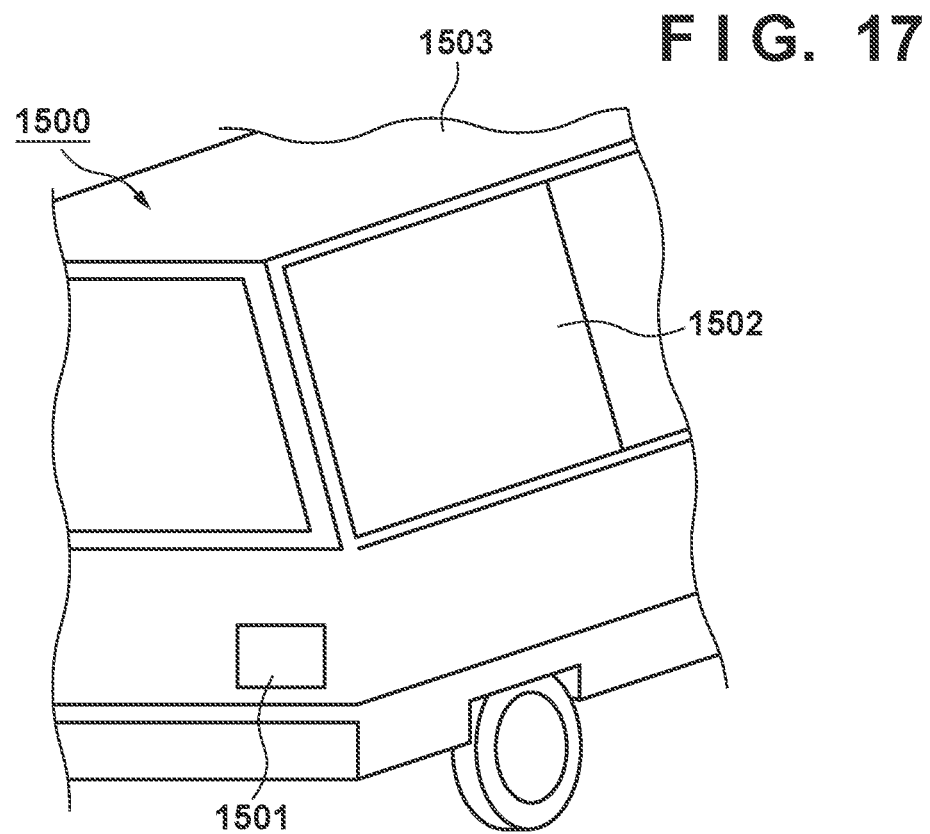
FIG. 17 is a view showing an example of a moving body using the light emitting device according to the embodiment.

FIG. 17 is a schematic view of an automobile having a taillight as an example of a vehicle lighting appliance using the light emitting device 10 of this embodiment. An automobile 1500 has a taillight 1501, and can have a form in which the taillight 1501 is turned on when performing a braking operation or the like. The light emitting device 10 of this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The light emitting device 10 according to this embodiment can be applied to the taillight 1501. The taillight 1501 can include a protection member for protecting the light emitting device 10 functioning as the taillight 1501. The material of the protection member is not limited as long as the material is a transparent material with a strength that is high to some extent, and an example is polycarbonate. The protection member may be made of a material obtained by mixing a furandicarboxylic acid derivative, an acrylonitrile derivative, or the like in polycarbonate.

The automobile 1500 can include a vehicle body 1503, and a window 1502 attached to the vehicle body 1503. This window can be a window for checking the front and back of the automobile, and can also be a transparent display. For this transparent display, the light emitting device 10 according to this embodiment may be used.

In this case, the constituent materials of the electrodes and the like of the light emitting device 10 are formed by transparent members.

Figure 18A:
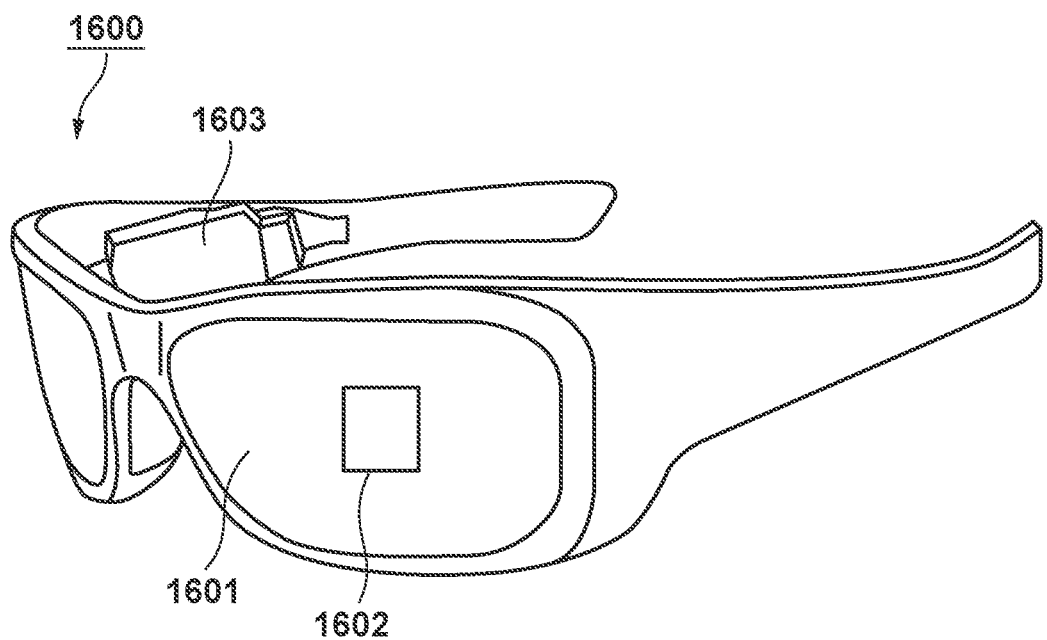
FIGS. 18A and 18B are views each showing an example of a wearable device using the light emitting device according to the embodiment.
Figure 18B:
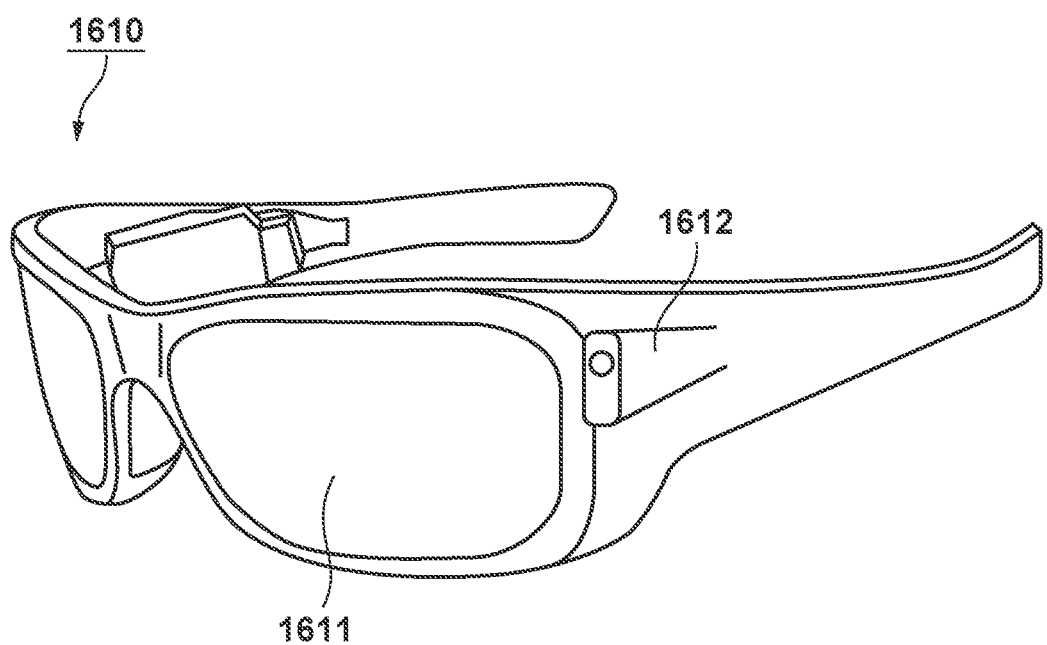
Figure 19:
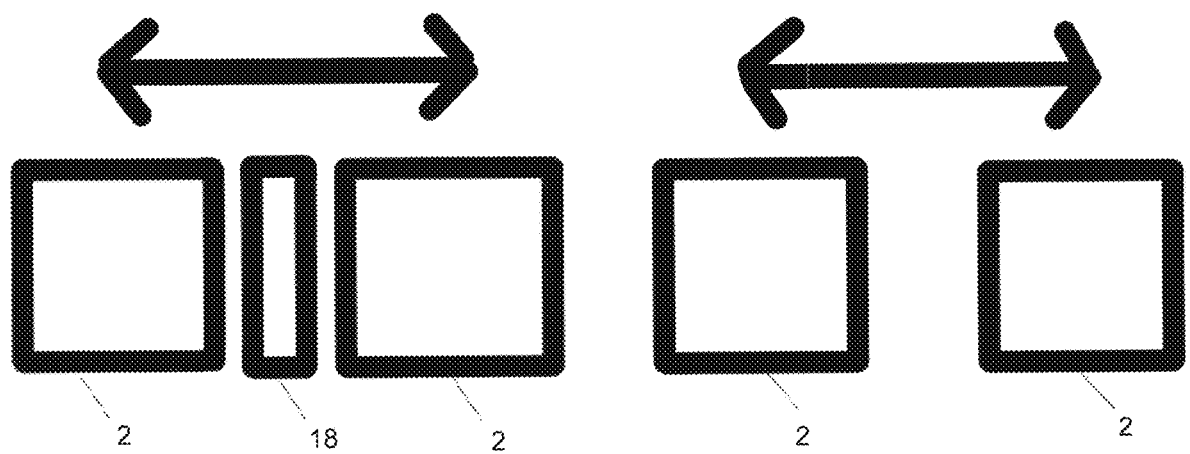
FIGS. 19 and 20 are schematic diagrams showing lower electrodes 2 and upper electric contact portion 18.
Figure 20:
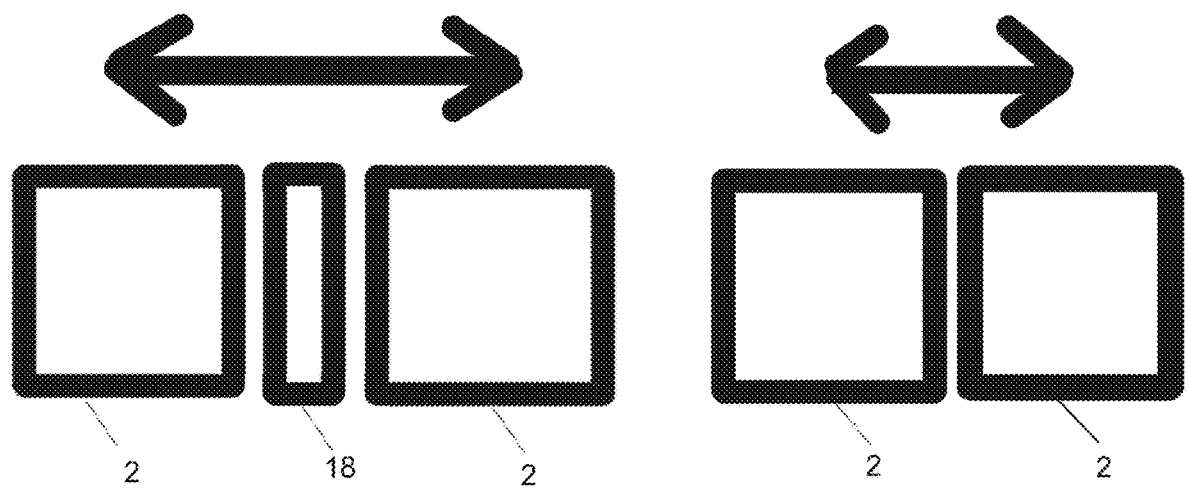

Further application examples of the light emitting device 10 according to this embodiment will be described with reference to FIGS. 18A and 18B. The light emitting device 10 can be applied to a system that can be worn as a wearable device such as smartglasses, an HMD (Head Mounted Display), or a smart contact lens. An image capturing display device used for such application examples includes an image capturing device capable of photoelectrically converting visible light and a light emitting device capable of emitting visible light.

Glasses 1600 (smartglasses) according to one application example will be described with reference to FIG. 18A. An image capturing device 1602 such as a CMOS sensor or an SPAD is provided on the surface side of a lens 1601 of the glasses 1600. In addition, the light emitting device 10 according to this embodiment is provided on the back surface side of the lens 1601.

The glasses 1600 further include a control device 1603. The control device 1603 functions as a power supply that supplies electric power to the image capturing device 1602 and the light emitting device 10 according to each embodiment. In addition, the control device 1603 controls the operations of the image capturing device 1602 and the light emitting device 10. An optical system configured to condense light to the image capturing device 1602 is formed on the lens 1601.

Glasses 1610 (smartglasses) according to one application example will be described with reference to FIG. 18B. The glasses 1610 include a control device 1612, and an image capturing device corresponding to the image capturing device 1602 and the light emitting device 10 are mounted on the control device 1612. The image capturing device in the control device 1612 and an optical system configured to project light emitted from the light emitting device 10 are formed in a lens 1611, and an image is projected to the lens 1611. The control device 1612 functions as a power supply that supplies electric power to the image capturing device and the light emitting device 10, and controls the operations of the image capturing device and the light emitting device 10. The control device 1612 may include a line-of-sight detection unit that detects the line of sight of a wearer. The detection of a line of sight may be done using infrared rays.

An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The light emitting device 10 according to the embodiment of the present invention can include an image capturing device including a light receiving element, and control a displayed image based on the line-of-sight information of the user from the image capturing device.

More specifically, the light emitting device 10 decides a first visual field region at which the user is gazing and a second visual field region other than the first visual field region based on the line-of-sight information. The first visual field region and the second visual field region may be decided by the control device of the light emitting device 10, or those decided by an external control device may be received. In the display region of the light emitting device 10, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the light emitting device 10, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the light emitting device 10, the image capturing device, or an external device. If the external device holds the AI program, it is transmitted to the light emitting device 10 via communication.

When performing display control based on line-of-sight detection, smartglasses further including an image capturing device configured to capture the outside can be applied. The smartglasses can display captured outside information in real time.

According to the present invention, it is possible to provide a technique advantageous in suppressing deterioration of display quality of the light emitting device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-202775, filed Dec. 14, 2021, which is hereby incorporated by reference herein in its entirety.

What is claimed is:

1. A light emitting device comprising a display region that comprises: a plurality of lower electrodes arranged on a main surface of a substrate; an organic layer including a light emitting layer arranged to cover the plurality of lower electrodes; an upper electrode arranged to cover the organic layer; a reflective layer arranged between the main surface and a corresponding one of the plurality of lower electrodes; and an insulating layer arranged between the reflective layer and the plurality of lower electrodes, wherein the reflective layer is arranged to overlap the corresponding one of the plurality of lower electrodes in orthogonal projection to the main surface, the plurality of lower electrodes include a first electrode and a second electrode adjacent to each other, an upper electrode contact portion configured to electrically connect the reflective layer and the upper electrode is arranged between the first electrode and the second electrode, and the upper electrode contact portion includes a via hole in which a conductive member configured to electrically connect the reflective layer and the upper electrode is arranged.

2. The device according to claim 1, wherein the upper electrode is electrically connected, via the reflective layer and the upper electrode contact portion, to a connecting portion arranged in a peripheral edge portion of the upper electrode.

3. The device according to claim 1, wherein a conductive pattern electrically connected to each of the plurality of lower electrodes is arranged between each of the plurality of lower electrodes and the main surface, and a distance from the main surface to the reflective layer is equal to a distance from the main surface to the conductive pattern.

4. The device according to claim 3, wherein in the orthogonal projection to the main surface, an area of the reflective layer is larger than an area of the conductive pattern.

5. The device according to claim 3, wherein a main component of the reflective layer is the same as a main component of the conductive pattern.

6. The device according to claim 3, wherein a conductive portion is arranged between each of the plurality of lower electrodes and the conductive pattern corresponding to each of the plurality of lower electrodes, and a main component of the conductive pattern is the same as a main component of the conductive member.

7. The device according to claim 1, wherein a main component of the plurality of lower electrodes is the same as a main component of the conductive member.

8. The device according to claim 1, wherein the reflective layer and the conductive member are electrically connected to each other via an electric corrosion suppression layer configured to suppress electric corrosion between the reflective layer and the conductive member.

9. The device according to claim 8, wherein the electric corrosion suppression layer contains titanium.

10. The device according to claim 1, wherein a concave portion is formed in a bottom portion of the via hole.

11. The device according to claim 10, wherein the reflective layer is arranged in the concave portion.

12. The device according to claim 1, wherein part of an inner wall of the conductive member along a side wall of the via hole is covered with the organic layer.

13. The device according to claim 12, wherein the upper electrode is in contact with a region, that is not covered with the organic layer, of the inner wall of the conductive member along the side wall of the via hole.

14. The device according to claim 1, wherein in the orthogonal projection to the main surface, a length between portions facing each other of an upper end of an inner wall of the conductive member along a side wall of the via hole is longer than twice a thickness of the organic layer.

15. The device according to claim 1, wherein
the plurality of lower electrodes and the upper electrode transmit light emitted from the light emitting layer, and
with respect to the insulating layer, a thickness of the insulating layer between the reflective layer and the first electrode is different from a thickness of the insulating layer between the reflective layer and the second electrode.

16. The device according to claim 1, wherein
the plurality of lower electrodes further include a third electrode and a fourth electrode adjacent to each other,
in the orthogonal projection to the main surface, the upper electrode contact portion is not arranged between the third electrode and the fourth electrode, and
a distance between centers of the first electrode and the second electrode is equal to a distance between centers of the third electrode and the fourth electrode.

17. The device according to claim 1, wherein
the plurality of lower electrodes further include a third electrode and a fourth electrode adjacent to each other, in the orthogonal projection to the main surface, the upper electrode contact portion is not arranged between the third electrode and the fourth electrode, and
a distance between centers of the first electrode and the second electrode is longer than a distance between centers of the third electrode and the fourth electrode.

18. A display device comprising the light emitting device according to claim 1, and an active element connected to the light emitting device.

19. A photoelectric conversion device comprising an optical unit including a plurality of lenses, an image sensor configured to receive light having passed through the optical unit, and a display unit configured to display an image,
wherein the display unit displays an image captured by the image sensor, and includes the light emitting device according to claim 1.

20. An electronic apparatus comprising a housing provided with a display unit, and a communication unit provided in the housing and configured to perform external communication,
wherein the display unit includes the light emitting device according to claim 1.

21. An illumination device comprising a light source, and at least one of a light diffusing unit and an optical film,
wherein the light source includes the light emitting device according to claim 1.

22. A moving body comprising a main body, and a lighting appliance provided in the main body,
wherein the lighting appliance includes the light emitting device according to claim 1.

23. A light emitting device comprising: a plurality of lower electrodes arranged on a main surface of a substrate; an organic layer including a light emitting layer arranged to cover the plurality of lower electrodes; an upper electrode arranged to cover the organic layer; a reflective layer arranged between the main surface and a corresponding one of the plurality of lower electrodes; and an insulating layer arranged between the reflective layer and the plurality of lower electrodes,
wherein the reflective layer is arranged to overlap the corresponding one of the plurality of lower electrodes in orthogonal projection to the main surface, and
in a region overlapping the organic layer in the orthogonal projection to the main surface, an upper electrode contact portion configured to electrically connect the reflective layer and the upper electrode is arranged.

* * * * *